(12) United States Patent
Watts, III

(10) Patent No.: US 7,672,818 B2
(45) Date of Patent: Mar. 2, 2010

(54) METHOD FOR SOLVING IMPLICIT RESERVOIR SIMULATION MATRIX EQUATION

(75) Inventor: James W. Watts, III, Houston, TX (US)

(73) Assignee: ExxonMobil Upstream Research Company, Houston, TX (US)

(*) Notice: Subject to any disclaimer, the term of this patent is extended or adjusted under 35 U.S.C. 154(b) by 425 days.

(21) Appl. No.: 11/579,966

(22) PCT Filed: Apr. 13, 2005

(86) PCT No.: PCT/US2005/012629

§ 371 (c)(1),
(2), (4) Date: Nov. 10, 2006

(87) PCT Pub. No.: WO2005/121840

PCT Pub. Date: Dec. 22, 2005

(65) Prior Publication Data

US 2007/0255779 A1    Nov. 1, 2007

Related U.S. Application Data

(60) Provisional application No. 60/577,541, filed on Jun. 7, 2004.

(51) Int. Cl.
  G06G 7/48 (2006.01)
  G06G 7/50 (2006.01)
(52) U.S. Cl. ............................................. 703/5; 703/10
(58) Field of Classification Search ............... 703/2, 703/10, 5, 6, 9
See application file for complete search history.

(56) References Cited

U.S. PATENT DOCUMENTS

| 3,017,934 A | 1/1962 | Rhodes et al. |
| 3,667,240 A | 6/1972 | Vilain |
| 3,702,009 A | 10/1972 | Baldwin, Jr. |
| 3,720,066 A | 3/1973 | Vilain |
| 3,785,437 A | 1/1974 | Clampitt et al. |
| 3,858,401 A | 1/1975 | Watkins |

(Continued)

FOREIGN PATENT DOCUMENTS

WO    WO 99/03054    1/1999

(Continued)

OTHER PUBLICATIONS

Acs, G. et al. (1985) "General Purpose Compositional Model," *Soc. of Petroleum Engineers Jrnl.*, 25, pp. 543-553.

(Continued)

*Primary Examiner*—Paul L Rodriguez
*Assistant Examiner*—Andre Pierre Louis
(74) *Attorney, Agent, or Firm*—ExxonMobil Upstream Research Company - Law Department

(57) ABSTRACT

A method for solving a matrix equation AX=B, wherein A represents a block sparse matrix, B represents a right hand side block vector and X represents a solution block vector. In one embodiment, the method includes receiving the block sparse matrix and the right hand side block vector, constructing a reduced transformed block sparse matrix from the block sparse matrix, constructing a reduced transformed residual block vector from the block sparse matrix and the right hand side block vector, and solving for the solution block vector using the reduced transformed block sparse matrix and the reduced transformed residual block vector.

50 Claims, 4 Drawing Sheets

U.S. PATENT DOCUMENTS

| | | |
|---|---|---|
| 3,992,889 A | 11/1976 | Watkins et al. |
| 4,099,560 A | 7/1978 | Fischer et al. |
| 4,154,300 A | 5/1979 | Vinatieri et al. ............. 166/252 |
| 4,176,986 A | 12/1979 | Taft et al. |
| 4,210,964 A | 7/1980 | Rogers et al. |
| 4,422,801 A | 12/1983 | Hale et al. |
| 4,467,868 A | 8/1984 | Adamache |
| 4,558,438 A | 12/1985 | Jones et al. |
| 4,633,446 A | 12/1986 | Kesner |
| 4,633,447 A | 12/1986 | Bodine |
| 4,646,840 A | 3/1987 | Bartholomew et al. |
| 4,715,444 A | 12/1987 | MacAllister et al. |
| 4,821,164 A | 4/1989 | Swanson |
| 4,918,643 A | 4/1990 | Wong |
| 4,969,116 A | 11/1990 | Wada et al. |
| 4,969,130 A | 11/1990 | Wason et al. |
| 4,991,095 A | 2/1991 | Swanson |
| 5,058,012 A | 10/1991 | Hinchman et al. |
| 5,076,357 A | 12/1991 | Marquis |
| 5,202,981 A | 4/1993 | Shackelford |
| 5,256,171 A | 10/1993 | Payne |
| 5,265,040 A | 11/1993 | Saji et al. |
| 5,305,209 A | 4/1994 | Stein et al. |
| 5,307,445 A | 4/1994 | Dalal et al. |
| 5,321,612 A | 6/1994 | Stewart |
| 5,408,638 A | 4/1995 | Sagawa et al. |
| 5,428,744 A | 6/1995 | Webb et al. |
| 5,442,569 A | 8/1995 | Osano |
| 5,465,323 A | 11/1995 | Mallet |
| 5,466,157 A | 11/1995 | Henderson et al. |
| 5,499,371 A | 3/1996 | Henninger et al. |
| 5,539,704 A | 7/1996 | Doyen et al. ................. 367/73 |
| 5,548,798 A | 8/1996 | King |
| 5,604,911 A | 2/1997 | Ushiro ....................... 395/800 |
| 5,629,845 A | 5/1997 | Liniger |
| 5,632,336 A | 5/1997 | Notz et al. |
| 5,684,723 A | 11/1997 | Nakadai |
| 5,706,897 A | 1/1998 | Horton, III |
| 5,710,726 A | 1/1998 | Rowney et al. ............. 364/578 |
| 5,711,373 A | 1/1998 | Lange |
| 5,740,342 A | 4/1998 | Kocberber |
| 5,757,663 A | 5/1998 | Lo et al. |
| 5,764,515 A | 6/1998 | Guerillot et al. |
| 5,794,005 A | 8/1998 | Steinman |
| 5,798,768 A | 8/1998 | Cacas |
| 5,819,068 A | 10/1998 | Hasse |
| 5,835,882 A | 11/1998 | Vienot et al. |
| 5,835,883 A | 11/1998 | Neff et al. |
| 5,838,634 A | 11/1998 | Jones et al. |
| 5,844,564 A | 12/1998 | Bennis et al. |
| 5,864,786 A | 1/1999 | Jericevic |
| 5,875,285 A | 2/1999 | Chang |
| 5,881,811 A | 3/1999 | Lessi et al. |
| 5,886,702 A | 3/1999 | Migdal et al. |
| 5,905,657 A | 5/1999 | Celniker |
| 5,913,051 A | 6/1999 | Leeke |
| 5,914,891 A | 6/1999 | McAdams et al. |
| 5,923,867 A | 7/1999 | Hand |
| 5,936,869 A | 8/1999 | Sakaguchi et al. |
| 5,953,239 A | 9/1999 | Teixeira et al. |
| 5,963,212 A | 10/1999 | Bakalash |
| 5,980,096 A | 11/1999 | Thalhammer-Reyero |
| 6,018,497 A | 1/2000 | Gunasekera |
| 6,038,389 A | 3/2000 | Rahon et al. |
| 6,052,520 A | 4/2000 | Watts, III ............... 395/500.31 |
| 6,052,650 A | 4/2000 | Assa et al. |
| 6,063,128 A | 5/2000 | Bentley et al. |
| 6,064,808 A * | 5/2000 | Kapur et al. ................... 703/2 |
| 6,078,869 A | 6/2000 | Gunasekera |
| 6,094,619 A | 7/2000 | Noetinger et al. |
| 6,101,477 A | 8/2000 | Hohle et al. |
| 6,106,561 A | 8/2000 | Farmer |
| 6,108,608 A | 8/2000 | Watts, III ..................... 702/30 |
| 6,128,577 A | 10/2000 | Assa et al. |
| 6,158,903 A | 12/2000 | Schaeffer et al. |
| 6,195,092 B1 | 2/2001 | Dhond et al. |
| 6,201,884 B1 | 3/2001 | Van Bemmel et al. |
| 6,219,440 B1 | 4/2001 | Schaff et al. |
| 6,230,101 B1 | 5/2001 | Wallis ......................... 702/16 |
| 6,236,894 B1 | 5/2001 | Stoisits et al. |
| 6,252,601 B1 | 6/2001 | Tanaka |
| 6,266,619 B1 | 7/2001 | Thomas et al. |
| 6,266,708 B1 | 7/2001 | Austvold et al. |
| 6,305,216 B1 | 10/2001 | Samaroo |
| 6,313,837 B1 | 11/2001 | Assa et al. |
| 6,356,844 B2 | 3/2002 | Thomas et al. |
| 6,370,491 B1 | 4/2002 | Malthe-Sorenssen et al. |
| 6,373,489 B1 | 4/2002 | Lu et al. |
| 6,408,249 B1 | 6/2002 | Teletzke |
| 6,453,275 B1 | 9/2002 | Schoenmaker et al. |
| 6,480,790 B1 | 11/2002 | Calvert et al. |
| 6,498,989 B1 | 12/2002 | Pisetski et al. ................. 702/14 |
| 6,549,879 B1 | 4/2003 | Cullick et al. |
| 6,631,202 B2 | 10/2003 | Hale |
| 6,633,837 B1 | 10/2003 | Dye et al. |
| 6,645,769 B2 | 11/2003 | Tayebi et al. |
| 6,662,109 B2 | 12/2003 | Roggero et al. |
| 6,662,146 B1 | 12/2003 | Watts, III ..................... 703/10 |
| 6,665,117 B2 | 12/2003 | Neff et al. |
| 6,674,432 B2 | 1/2004 | Kennon et al. |
| 6,694,264 B2 | 2/2004 | Grace |
| 6,801,197 B2 | 10/2004 | Sanstrom |
| 6,810,370 B1 | 10/2004 | Watts, III ..................... 703/10 |
| 6,826,483 B1 | 11/2004 | Anderson et al. |
| 6,826,520 B1 | 11/2004 | Khan et al. |
| 6,853,921 B2 | 2/2005 | Thomas et al. |
| 6,907,392 B2 | 6/2005 | Bennis et al. |
| 6,922,662 B2 | 7/2005 | Manceau et al. |
| 6,928,399 B1 | 8/2005 | Watts, III ....................... 703/2 |
| 6,941,255 B2 | 9/2005 | Kennon et al. |
| 6,943,697 B2 | 9/2005 | Ciglenec et al. |
| 6,989,841 B2 | 1/2006 | Docherty |
| 7,006,951 B2 | 2/2006 | Pond, Jr. et al. |
| 7,006,959 B1 | 2/2006 | Huh et al. |
| 7,027,964 B2 | 4/2006 | Kennon |
| 7,043,413 B2 | 5/2006 | Ward et al. |
| 7,047,165 B2 | 5/2006 | Balaven et al. |
| 7,050,612 B2 | 5/2006 | Hale |
| 7,149,671 B2 | 12/2006 | Lim et al. |
| 7,260,508 B2 | 8/2007 | Lim et al. |
| 7,277,836 B2 | 10/2007 | Netemeyer et al. |
| 7,289,943 B2 | 10/2007 | Barroux |
| 7,295,706 B2 | 11/2007 | Wentland et al. |
| 7,310,579 B2 | 12/2007 | Ricard et al. |
| 7,324,929 B2 | 1/2008 | Huh et al. |
| 7,343,275 B2 | 3/2008 | Lenormand et al. |
| 7,369,973 B2 | 5/2008 | Kennon et al. |
| 7,379,853 B2 | 5/2008 | Middya |
| 7,451,066 B2 | 11/2008 | Edwards et al. |
| 7,526,418 B2 | 4/2009 | Pita et al. |
| 7,546,229 B2 | 6/2009 | Jenny et al. |
| 7,584,086 B2 | 9/2009 | Frankel |
| 7,603,265 B2 | 10/2009 | Mainguy et al. |
| 2002/0067373 A1 | 6/2002 | Roe et al. |
| 2002/0169589 A1 | 11/2002 | Banki et al. |
| 2005/0165555 A1 | 7/2005 | Jackson |
| 2005/0273303 A1 | 12/2005 | Flandrin et al. |
| 2006/0047489 A1 | 3/2006 | Scheidt |
| 2008/0097730 A1* | 4/2008 | Canning ........................ 703/1 |
| 2008/0167849 A1 | 7/2008 | Hales et al. |

FOREIGN PATENT DOCUMENTS

| | | |
|---|---|---|
| WO | WO 99/52048 | 10/1999 |

| WO | WO 99/53342 | 10/1999 |
| WO | WO 99/57418 | 11/1999 |
| WO | WO 00/14574 | 3/2000 |
| WO | WO 00/28456 | 5/2000 |
| WO | WO 01/71640 | 9/2000 |
| WO | WO 00/75854 | 12/2000 |
| WO | WO 01/91032 | 11/2001 |
| WO | WO 01/92915 | 12/2001 |
| WO | WO 02/52502 | 7/2002 |
| WO | WO 02/57901 | 7/2002 |
| WO | WO 02/73236 | 9/2002 |
| WO | WO 02/82352 | 10/2002 |
| WO | WO 2005/106537 | 11/2005 |

OTHER PUBLICATIONS

Byer, T. J. et al. (1999) "A Preconditioned Adaptive Implicit Method for Reservoirs With Surface Facilities," *Soc. of Petroleum Engineers*, SPE 51895, pp. 173-181.

Coats, K. H. (1999) "A Note on Impes and Some Impes-Based Simulation Models," *Soc. of Petroleum Engineers*, SPE 49774, pp. 21-39.

Durlofsky, L. J. et al. (1999) "Scale Up in the Near-Well Region," *Soc. of Petroleum Engineers*, SPE 51940, 463-472.

Farkas (1997) "Linearization Techniques of Reservoir Simulator Equations: Fully Implicit Cases," Soc. of Petroleum Engineers, SPE 37984, pp. 87-95.

Fung, Larry S-K et al. (1989) "An Adaptive-Implicit Switching Criterion Based on Numerical Stability Analysis," *Soc. of Petroleum Engineers*, SPE 16003, pp. 45-51.

Gautier, Y. et al. (1999) "Nested Gridding and Streamline-Based Simulation for Fast Reservoir Performance Prediction," *Soc. of Petroleum Engineers*, SPE 51931, Feb. 14-17, 1999, pp. 403-412.

Golub, G. et al. (1965) "Calculating the Singular Values and Pseudo-Inverse of a Matrix," *SIAM Journal on Numerical Analysis*, v.2.2, pp. 205-224.

Golub, G. Et al. (1989) *Matrix Computations*, second Edition, The Johns Hopkins University Press, pp. vii-ix, 427-436.

Li, Baoyan et al. (2004) "Comparison of Solution Schemes for Black Oil Reservoir Simulations With Unstructured Grids," *Comput. Methods Appl. Mech. Eng.*, 193.3, XP002309410, pp. 319-355.

Mifflin et al. (1991) "A Fully Coupled, Fully Implicit Reservoir Simulator for Thermal and Other Complex Reservoir Process," *Soc. of Petroleum Engineers*, SPE 21252, pp. 457-470.

Press, W. H. et al. (1994) Numerical Recipes, Second Edition, Cambridge University Press, pp. iv-ix, 52-64.

Rodriquez, F. et al. (1994) "A General Formulation for Compositional Reservoir Simulation," *Soc. of Petrolem Engineers*, SPE 28705, pp. 377-390.

Russell, T. F. (1989) "Stability Analysis and Switching Criteria for Adaptive Implicit Methods Based on the CFL Condition," *Soc. of Petroleum Engineers*, SPE 18416, pp. 97-107.

Spillette, A. G. et al. (1973) "A High-Stability Solution Approach to Reservoir Simulation," *Soc. of Petroleum Engineers*, SPE 4542, Sep. 30-Oct. 3, 1973.

Thomas, G. W. et al. (1983) "Reservoir Simulation Using an Adaptive Implicit Method," *Soc. of Petroleum Engineers*, SPE 10120, pp. 759-768.

Tseng, P-H et al. (2000) "A reduced Degree of Freedom Method for Simulating Non-Isothermal Multi-Phase Flow in a Porous Medium," *Advances in Water Resources*, 23.7, XP002309409, pp. 713-745.

Vinsome, P. K. W. (1976) "Orthomin, an Iterative Method for Solving Sparse Sets of Simultaneous Linear Equations," *Soc. of Petroleum Engineer*, SPE 5729, 149-153, 7 pages of Figures.

Wallis, J. R. (1983) "Incomplete Gaussian Elimination as a Preconditioning for Generalized Conjugate Gradient Acceleration," *Soc. of Petroleum Engineers*, SPE 12265, Nov. 15-18, 1983.

Wallis, J. R. et al. (1985) "Constrained Residual Acceleration of Conjugate Residual Methods," *Soc. of Petroleum Engineers*, SPE 13536, Feb. 10-13, 1985, pp. 415-427.

Wallis, J. R. et al. (1991) "A New Parallel Iterative Linear Solution Method for Large Scale Reservoir Simulation," *Soc. of Petroleum Engineers*, SPE 21209, Feb. 17-20, 1991, 10 pages.

Watts, J. W. (1971) "An iterative Matrix Solution Method Suitable for Anisotropic Problems," *Soc. of Petroleum Engineers Journal*, SPE 2802, Mar. 1971, pp. 47-51.

Watts, J. W. et al. (1976) "An Approximate Three-Dimensional Reservoir Simulation Model," *Soc. of Petroleum Engineers Journal*, SPE 6103, Oct. 1976, 20 pages.

Watts, J. W. (1981) "A Conjugate Gradient-Truncated Direct Method for the Iterative Solution of the Reservoir Simulation Pressure Equation," *Soc. of Petroleum Jrnl.*, SPE 8252, pp. 345-353.

Watts, J. W. (1986) "A Compositional Formulation of the Pressure and Saturation Equations," *Soc. of Petroleum Engineers, Reservoir Engineering*, May 1986, pp. 243-252.

Watts, J. W. (1997) "Reservoir Simulation: Past, Present and Future," *Soc. of Petroleum Engineering-Computer Applications*, SPE 38441, Jun. 8-11, 1997, pp. 171-176.

Watts, J. W. (1999) "A Total-Velocity Sequential Preconditioner for Solving Implicit Reservoir Simulation Matrix Equations," *Soc. of Petroleum Engineers*, SPE 51909, Feb. 14-17, 1999, pp. 283-284.

Watts, J. W. (1999) "An Algebraic Approach to the Adaptive Implicit Method," *Soc. of Petroleum Engineers*, SPE 51900, Feb. 14-17, 1999, pp. 221-230.

Watts, J. W. (2004) "A New Method for Solving the Implicit Reservoir Simulation Matrix Equation," *Soc. of Petroleum Engineers*, SPE 93068, Jan. 3-Feb. 2, 2005, 7 pages.

Young et al. (1983) "A Generalized Compositional Approach for Reservoir Simulation," *Soc. of Petroleum Engineers*, SPE 10516, pp. 727-742.

Young, L.C. et al. (1993) "Implementation of an Adaptive Implicit Method," *Soc. of Petroleum Engineers*, SPE 25245, pp. 113-126.

EP Standard Search No. 111645, dated Dec. 17, 2004, 1 page.

* cited by examiner

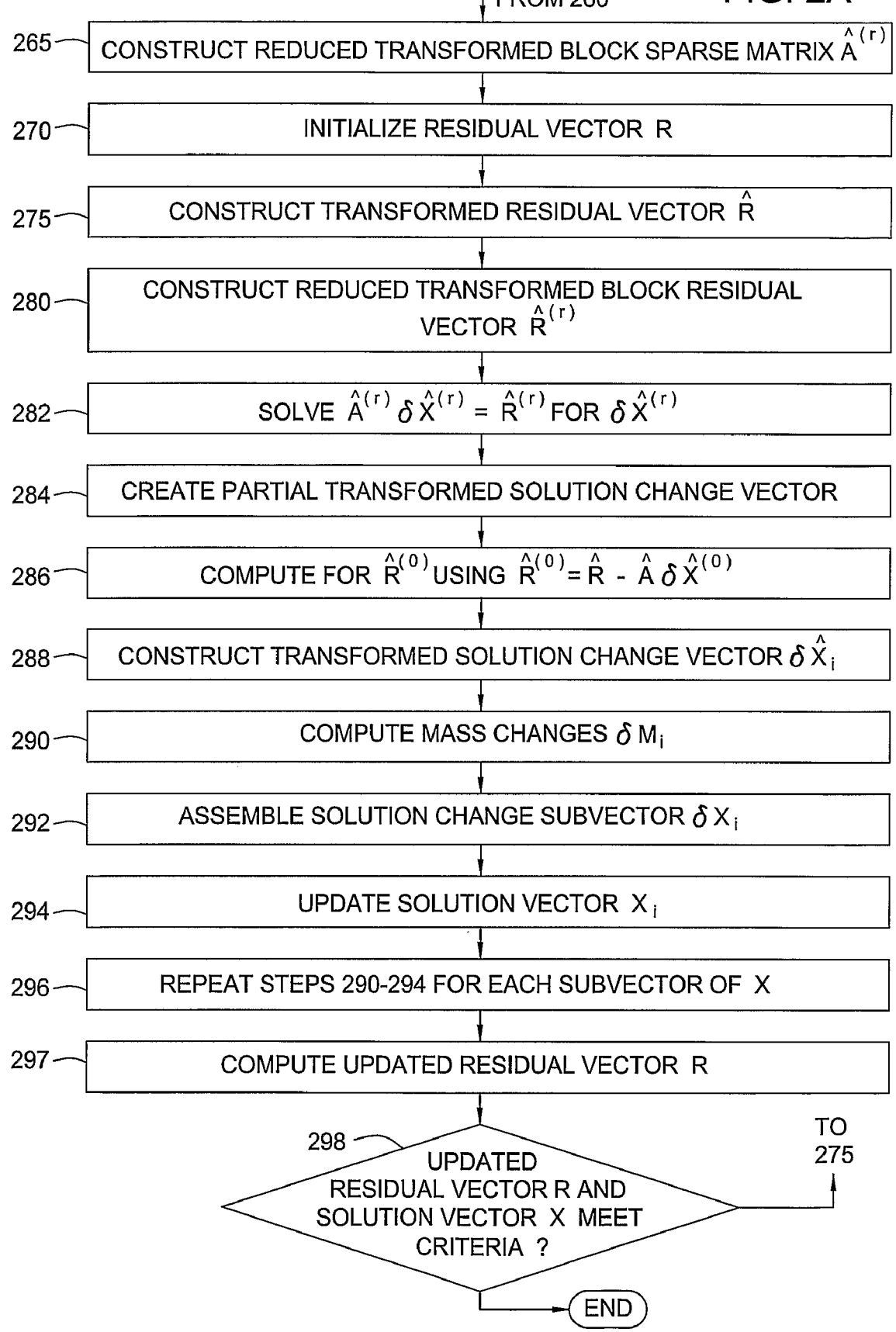

US 7,672,818 B2

METHOD FOR SOLVING IMPLICIT RESERVOIR SIMULATION MATRIX EQUATION

This application is the National Stage of International Application No. PCT/US2005/012629, filed 13 Apr. 2005, which claims the benefit of U.S. Provisional Application No. 60/577,541, filed on 7 Jun. 2004.

BACKGROUND

1. Field of Inventions

Embodiments of the present inventions generally relate to exploitation and development of hydrocarbons in an underground reservoir and, more preferably, to an improved process for predicting the behavior of a subterranean, hydrocarbon-bearing formation.

2. Description of Related Art

Reservoir simulation is a process of inferring the behavior of a real reservoir from the performance of a model of that reservoir. Because mass transfer and fluid flow processes in petroleum reservoirs are so complex, reservoir simulations are done using computers. Computer programs that perform calculations to simulate reservoirs are called reservoir simulators. The objective of reservoir simulation is to understand the complex chemical, physical, and fluid flow processes occurring in a petroleum reservoir sufficiently well to be able to predict future behavior of a reservoir and to maximize recovery of hydrocarbons. The reservoir simulator can solve reservoir problems that are generally not solvable in any other way. For example, a reservoir simulator can predict the consequences of reservoir management decisions. Reservoir simulation often refers to the hydrodynamics of flow within a reservoir, but in a larger sense it also refers to the total petroleum system which includes the reservoir, the surface facilities, and any interrelated significant activity.

FIG. 1 illustrates schematically four basic steps in one example of a reservoir simulation of a petroleum reservoir. The first step (step 1) is to construct a mathematical model of a real reservoir based on the chemical, physical, and fluid flow processes occurring in the reservoir. That mathematical model may include a set of nonlinear partial differential equations. The second step (step 2) involves discretization of the reservoir in both time and space. Space is discretized by dividing the reservoir into suitable gridcells with each gridcell having a set of nonlinear finite difference equations. The third step (step 3) is to linearize the nonlinear terms that appear in the nonlinear finite difference equations and, based on this linearization, construct linear algebraic equations assembled in a matrix equation. The fourth step (step 4) is to solve the linear algebraic equations assembled in the matrix equation. The simulation proceeds in a series of timesteps, and steps 3 and 4 are performed at each timestep. The simulation provides a prediction of reservoir behavior, which enables a petroleum engineer to predict reservoir performance, including the rate at which the reservoir can be produced. The accuracy of the model can be checked against the history of the reservoir after the model has been subjected to a simulated recovery process.

However, many simulation methods have been proposed. The method chosen can affect the stability and accuracy of the solution. Some methods require more computational work than other methods on a per-timestep basis. The methods differ primarily on how they treat the way the reservoir variables (such as pressure and saturation) vary in time. Most methods involve variations of the following two procedures:

(1) Explicit procedures use mobilities and capillary pressures computed as functions of saturations at the beginning of a timestep. The saturations are known from the previous timestep calculations. The mobilities and capillary pressures are assumed to maintain the same values during a timestep that they had at the beginning of the timestep.

(2) Implicit procedures use mobility and capillary pressure calculated as functions of saturation at the end of the timestep. The values are not known until calculations for the timestep have been completed. As a result, they must be determined using an iterative process.

The Fully Implicit method is a commonly used implicit procedure. This method is unconditionally stable because it treats both pressure and saturations implicitly. Flow rates are computed using phase pressures and saturations at the end of each timestep. In this method, saturations cannot fall below zero because a fluid can flow only if it is mobile at the end of a timestep. Fluids are mobile only for saturations greater than zero. The calculation of flow rates, pressure and saturation solutions involves the solution of nonlinear equations using a suitable iterative technique. Once the pressures and saturations are solved, these terms will continue to be updated using the new values of pressure and saturation. The iteration process terminates when the convergence criteria are satisfied.

The main drawback of the Fully Implicit method is the amount of computer time that it requires. In terms of computing cost, the method is generally satisfactory in models of single wells or parts of a reservoir, but it can be quite expensive to use in models of entire reservoirs. Several attempts have been made to reduce the computations required, possibly at the cost of accepting a method that does not permit the timestep sizes of the Fully Implicit method. The sequential implicit method, the adaptive implicit method, and the Cascade method have been proposed as ways of reducing the computational time. However, those methods have their own drawbacks. The largest consumer of computational time in the Fully Implicit method is the equation solving step (Step 4 of FIG. 1). This typically consumes about three-fourths of the total computational time.

Accordingly, a need exists for a more computationally efficient method for solving the linear algebraic equations arising in Fully Implicit reservoir simulation.

SUMMARY

Various embodiments of the invention are directed to a method for solving a matrix equation AX=B, wherein A represents a block sparse matrix, B represents a right hand side block vector and X represents a solution block vector. In one embodiment, the method includes receiving the block sparse matrix and the right hand side block vector, constructing a reduced transformed block sparse matrix from the block sparse matrix, constructing a reduced transformed residual block vector from the block sparse matrix and the right hand side block vector, and solving for the solution block vector using the reduced transformed block sparse matrix and the reduced transformed residual block vector.

In another embodiment, the method includes constructing a reduced transformed block sparse matrix from the block sparse matrix, constructing a reduced transformed residual block vector from the block sparse matrix and the right hand side block vector, solving for a reduced transformed solution change block vector using the reduced transformed block sparse matrix and the reduced transformed residual block vector, converting the reduced transformed solution change block vector to a solution change block vector having one or more changes in mass unknowns and one or more changes in pressure unknowns, and adding the solution change block vector to a current estimate of the solution block vector to update the solution block vector.

DETAILED DESCRIPTION

Introduction and Definitions

Figure 1:
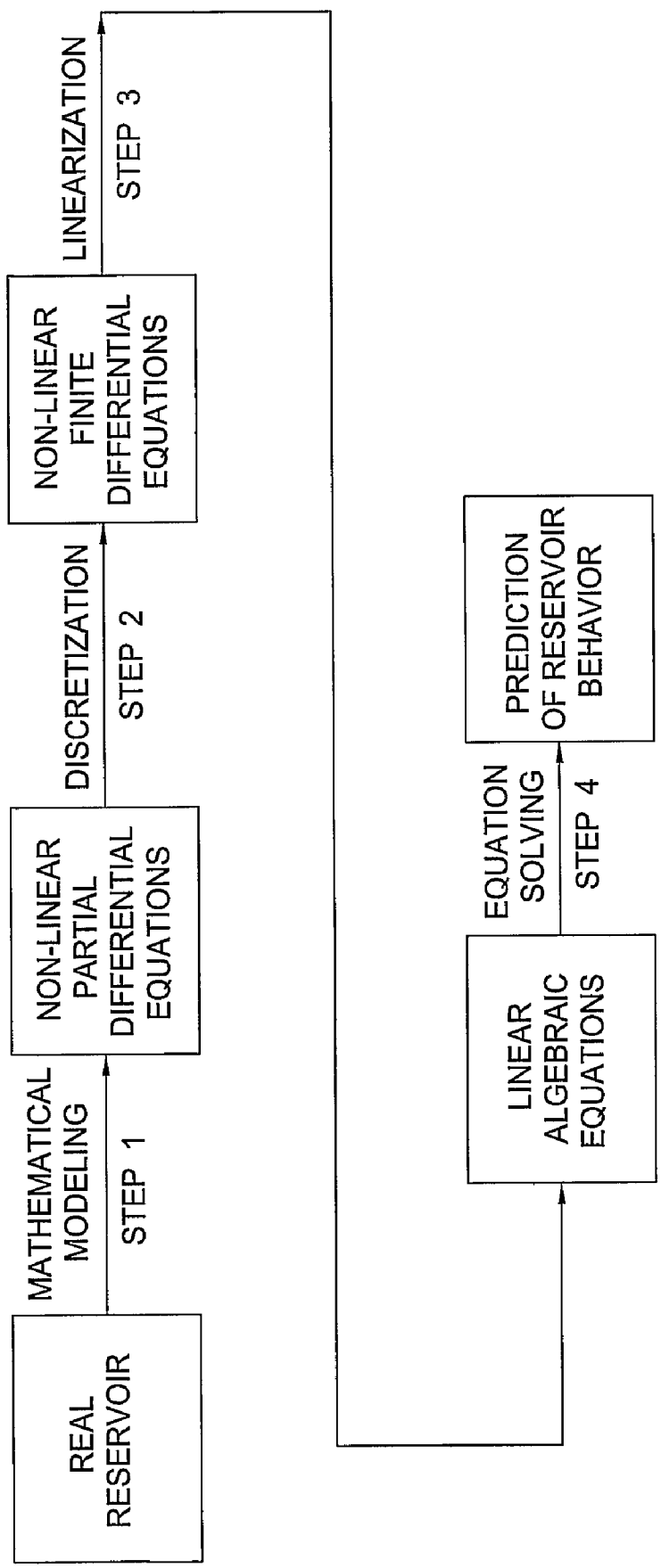
FIG. 1 illustrates a schematic diagram of the basic steps in an illustrative reservoir simulation process.

A detailed description will now be provided. Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims. Each of the inventions will now be described in greater detail below, including specific embodiments, versions and examples, but the inventions are not limited to these embodiments, versions or examples, which are included to enable a person having ordinary skill in the art to make and use the inventions, when the information in this patent is combined with available information and technology. Various terms as used herein are defined below. To the extent a term used in a claim is not defined below, it should be given the broadest definition persons in the pertinent art have given that term as reflected in one or more printed publications or issued patents.

As used herein, the term "gridcell" is defined as a unit or block that defines a portion of a three dimensional reservoir model. As such, a three dimensional reservoir model may include a number of gridcells, ranging from tens and hundreds to thousands and millions of gridcells. Each gridcell may in certain cases represent a specifically allocated portion of the three dimensional reservoir model. An entire set of gridcells may constitute a geologic model that represents a subsurface earth volume of interest. Each gridcell preferably represents a unique portion of the subsurface. Such gridcells preferably do not overlap each other. Dimensions of the gridcells are preferably chosen so that the reservoir properties within a gridcell are relatively homogeneous, yet without creating an excessive number of gridcells. These gridcells have sides ranging from a smaller than a meter to a few hundred meters. Preferably, each gridcell is square or rectangular in plan view and has a thickness that is either constant or variable. However, it is contemplated that other shapes may alternatively be used. Gridcells may be visualized as well-stirred tanks with permeable sides. The contents of a gridcell, therefore, may be considered uniformly distributed within the gridcell and the rates at which fluids flow in or out maybe determined by the permeabilities of the sides of the gridcell and the pressure differences between adjacent gridcells. As such, the mathematical problem is reduced to a calculation of flow between adjacent gridcells.

As used herein, the term "singular value decomposition" is defined as a mathematical technique for decomposing a rectangular matrix into three factors. Given an M by N matrix A, where M>N, using at least certain types of singular value decomposition, matrix A can be rewritten as:

$$[A] = [U][W][V^T]$$

where W is a diagonal matrix having "singular values" entries. The columns of matrix U and the rows of matrix $V^T$ (or, equivalently, columns of matrix V) are orthonormal. That is, for example, if $U_i$ is a column of matrix U and $U_j$ is another column of matrix U, then $$U_i^T U_i = 1$$

$$U_i^T U_j = 0, j \neq i$$

The equivalent is true for the square matrix V, i.e., the inverse of matrix V is matrix $V^T$. The columns of matrix U, diagonal entries of matrix W, and rows of matrix $V^T$ are customarily arranged such that $w_1 > w_2 > \ldots > w_N$, where $w_i$ is the diagonal entry in row i of matrix W. The diagonal elements of matrix W are the singular values of matrix A. For purposes of illustrating various embodiments of the invention, it is more convenient to place them in the opposite order, such that $w_1 < w_2 < \ldots < w_N$, and reorder the columns of U and V accordingly. Matrix V may be referred to as the right matrix and the vectors comprised therein as the right singular vectors.

Given the above definitions, matrix A can be approximated using a subset containing the last few columns of matrix U, entries of matrix W, and rows of matrix $V^T$. Thus, matrix A can be rewritten as:

$$[A] \approx [U_S][W_S I \quad V_S^T].$$

As used herein, the term "timestep" is defined as an increment of time into which the life of a reservoir is discretized. For at least certain types of timesteps, a reservoir simulator computes changes in each gridcell (flow, pressure, etc.) over a timestep for many timesteps. Typically, conditions are defined only at the beginning and end of a timestep, and nothing is defined at any intermediate time within a timestep. Consequently, conditions within each gridcell may change abruptly from one timestep to the next. Usually, timesteps are chosen to be small enough to limit sizes of these abrupt changes to acceptable limits. The size of the timesteps depends on accuracy considerations and stability constraints. Generally, the smaller the timestep, the more accurate the solution, however, smaller timesteps require more computational work.

As used herein, the term "identity matrix" is defined as a square matrix of any dimension whose elements are ones on its northwest-to-southeast diagonal and zeroes everywhere else. Any square matrix multiplied by the identity matrix with those dimensions equals itself.

As used herein, the term "volume constraint" is an equation based on the principle that a gridcell must contain the amount of fluid required to fill the gridcell at a given time. For example, if a reservoir contains liquid hydrocarbon and water phases, then:

Liquid Hydrocarbon Volume+Water Volume=Gridcell Volume.

As used herein, the term "unknown" is defined as an unknown variable for which the linear algebraic equations assembled in the matrix equation are solved. For a reservoir containing oil and water, the linear algebraic equations are solved for various unknown variables, including pressure and mass. Other quantities may be derived from these variables.

As used herein, the term "block sparse matrix" is defined as a matrix whose elements are mostly null or zeroes and submatrices as the remainder. However, all of the submatrices along its diagonal are present, i.e., not null. For example, a block sparse matrix A may be expressed as:

$$A = \begin{bmatrix} A_{11} & A_{12} & \cdots & A_{1n} \\ A_{21} & A_{22} & \cdots & A_{2n} \\ \cdots & \cdots & \cdots & \cdots \\ A_{n1} & A_{n2} & \cdots & A_{nn} \end{bmatrix}.$$

Each submatrix, e.g., $A_{ij}$, may be expressed as:

$$A_{ij} = \begin{bmatrix} a_{11}^{(ij)} & a_{12}^{(ij)} & \cdots & a_{1,m_j+1}^{(ij)} \\ a_{21}^{(ij)} & a_{22}^{(ij)} & \cdots & a_{2,m_j+1}^{(ij)} \\ \cdots & \cdots & \cdots & \cdots \\ a_{m_i+1,1}^{(ij)} & a_{m_i+1,2}^{(ij)} & \cdots & a_{m_i+1,m_j+1}^{(ij)} \end{bmatrix}$$

where $m_i$ is the number of mass balance equations in row i and $m_j$ is the number of mass change unknowns in column j. Each submatrix has $m_i+1$ rows and $m_j+1$ columns. The first $m_i$ rows contain coefficients of the mass balance equations. The bottom row (row $m_i+1$) contains coefficients relating to the volume constraint equation. The coefficients in the first $m_j$ columns are configured to be multiplied by mass variables and the coefficients in the right-most column (column $m_j+1$) are configured to be multiplied by pressure variables. As such, each submatrix has a particular structure.

The mass variables can take several forms. Generally, the mass variables are changes over a Newton iteration. But, they can also be changes over a timestep or end-of-timestep masses, and not changes. They also can be expressed in terms of other measures of masses, such as saturations or mole/mass fractions. Similarly, pressure variables are generally changes over a Newton iteration, but can also be end-of-timestep pressures. These variable choices are interchangeable in the sense that one set of variables can be easily converted to another. For simplicity, the description that follows uses end-of-timestep masses and pressures.

For an off diagonal submatrix, where i≠j, $A_{ij}$ may be expressed as:

$$A_{ij} = \begin{bmatrix} f_{11}^{(ij)} & f_{12}^{(ij)} & \cdots & f_{1,m_j}^{(ij)} & \varphi_1^{(ij)} \\ f_{21}^{(ij)} & f_{22}^{(ij)} & \cdots & f_{2,m_j}^{(ij)} & \varphi_2^{(ij)} \\ \cdots & \cdots & \cdots & \cdots & \cdots \\ f_{m_i,1}^{(ij)} & f_{m_i,2}^{(ij)} & \cdots & f_{m_i,m_j}^{(ij)} & \varphi_{m_i}^{(ij)} \\ 0 & 0 & \cdots & 0 & 0 \end{bmatrix}$$

where $f$ and $\varphi$ coefficients relate to the flows between gridblocks. The $f$ coefficients, which occupy the first $m_i$ columns of $A_{ij}$, are configured to be multiplied by mass changes. Thus, they may be referred to as mass change terms coefficients. The $\varphi$ coefficients, which occupy the column $m_{j+1}$ of $A_{ij}$, are configured to be multiplied by pressure changes. Thus, the $\varphi$ coefficients may be referred to as pressure change terms coefficients. The $f$ coefficients are used in the singular value decomposition, while the $\varphi$ coefficients are not.

$A_{ij}$ may also be expressed as:

$$A_{ij} = \begin{bmatrix} F_{ij} & \Phi_{ij} \\ 0 & 0 \end{bmatrix}$$

where $$F_{ij} = \begin{bmatrix} f_{11}^{(ij)} & f_{12}^{(ij)} & \cdots & f_{1,m_j}^{(ij)} \\ f_{21}^{(ij)} & f_{22}^{(ij)} & \cdots & f_{2,m_j}^{(ij)} \\ \cdots & \cdots & \cdots & \cdots \\ f_{m_i,1}^{(ij)} & f_{m_i,2}^{(ij)} & \cdots & f_{m_i,m_j}^{(ij)} \end{bmatrix} \text{ and } \Phi_{ij} = \begin{bmatrix} \varphi_1^{(ij)} \\ \varphi_2^{(ij)} \\ \cdots \\ \varphi_{m_i}^{(ij)} \end{bmatrix}.$$

The diagonal submatrix $A_{ii}$ may be expressed as $$A_{ii} = \begin{bmatrix} 1+f_{11}^{(ii)} & f_{12}^{(ii)} & \cdots & f_{1,m_i}^{(ii)} & \varphi_1^{(ii)} \\ f_{21}^{(ii)} & 1+f_{22}^{(ii)} & \cdots & f_{2,m_i}^{(ii)} & \varphi_2^{(ii)} \\ \cdots & \cdots & \cdots & \cdots & \cdots \\ f_{m_i,1}^{(ii)} & f_{m_i,2}^{(ii)} & \cdots & 1+f_{m_i,m_i}^{(ii)} & \varphi_{m_i}^{(ii)} \\ \tilde{V}_1^{(i)} & \tilde{V}_2^{(i)} & \cdots & \tilde{V}_{m_i}^{(i)} & c_i \end{bmatrix}$$

where $f$ and $\varphi$ coefficients relate to the flows between gridblocks, $\tilde{V}$'s are fluid partial volumes, and the c relates to compressibility.

$A_{ii}$ may also be expressed as:

$$A_{ii} = \begin{bmatrix} I + F_{ii} & \Phi_{ii} \\ \tilde{V}_i & c_i \end{bmatrix}$$

where $F_{ii} = \begin{bmatrix} f_{11}^{(ii)} & f_{12}^{(ii)} & \cdots & f_{1,mi}^{(i)} \\ f_{21}^{(ii)} & f_{22}^{(ii)} & \cdots & f_{2,m_i}^{(ii)} \\ \cdots & \cdots & \cdots & \cdots \\ f_{m_i,1}^{(ii)} & f_{m_i,2}^{(ii)} & \cdots & f_{m_i,m_i}^{(ii)} \end{bmatrix},$ $$\Phi_{ii} = \begin{bmatrix} \phi_1^{(ii)} \\ \phi_2^{(ii)} \\ \cdots \\ \phi_{m_i}^{(ii)} \end{bmatrix}, \tilde{V}_j = \begin{bmatrix} \tilde{V}_1^{(i)} & V_2^{(i)} & \cdots & \tilde{V}_{m_j}^{(i)} \end{bmatrix} \text{ and } i$$

is an identity matrix. The entries of $\tilde{V}_j$ are multiphase partial volumes. They relate the fluid volume in the gridcell to the amounts of the components in it. The $c_i$ term is related to fluid compressibility. It relates the gridcell's fluid volume to its pressure.

As used herein, the term "column matrix" is defined as a matrix containing the submatrices in a column of the block sparse matrix. For example, the $j^{th}$ column matrix of A is $$A_j = \begin{bmatrix} A_{1j} \\ A_{2j} \\ \ldots \\ A_{n1,j} \end{bmatrix}$$

As used herein, the term "solution block vector" is defined as a block vector comprised of subvectors $X_1 \ldots X_n$. For example, a solution block vector X may be expressed as:

$$X = \begin{bmatrix} X_1 \\ X_2 \\ \ldots \\ X_n \end{bmatrix}.$$

Each subvector may be expressed as:

$$X_i = \begin{bmatrix} x_1^{(i)} \\ x_2^{(i)} \\ \\ x_{m_i}^{(i)} \\ x_{m_i+1}^{(i)} \end{bmatrix} \text{ or } X_i = \begin{bmatrix} m_1^{(i)} \\ m_2^{(i)} \\ \ldots \\ m_{m_i}^{(i)} \\ p^{(i)} \end{bmatrix} \text{ or } X_i = \begin{bmatrix} M_i \\ P_i \end{bmatrix}$$

where m or M represents a mass unknown and p or P represents a pressure unknown.

In some instances, a solution change vector $\delta X$ may be of interest, as opposed to the solution block vector X. The solution change vector $\delta X$ may be expressed as:

$$\delta X_i = \begin{bmatrix} \delta x_1^{(i)} \\ \delta x_2^{(i)} \\ \\ \delta x_{m_i}^{(i)} \\ \delta x_{m_i+1}^{(i)} \end{bmatrix} \text{ or } \delta X_i = \begin{bmatrix} \delta m_1^{(i)} \\ \delta m_2^{(i)} \\ \ldots \\ \delta m_{m_i}^{(i)} \\ \delta p^{(i)} \end{bmatrix} \text{ or } \delta X_i = \begin{bmatrix} \delta M_i \\ \delta P_i \end{bmatrix}.$$

As used herein, the term "right hand side block vector" is defined as the right hand side of the equation AX=B. For example, a subvector of the right hand side block vector B may be expressed as:

$$B_i = \begin{bmatrix} b_1^{(i)} \\ b_2^{(i)} \\ \ldots \\ b_{m_i}^{(i)} \\ b_{m_i+1}^{(i)} \end{bmatrix} \text{ or } B_i = \begin{bmatrix} b_{M,1}^{(i)} \\ b_{M,2}^{(i)} \\ \ldots \\ b_{M,m_i}^{(i)} \\ b_V^{(i)} \end{bmatrix} \text{ or } B_i = \begin{bmatrix} B_{M,i} \\ B_{V,i} \end{bmatrix}$$

where the M subscript denotes a mass balance right-hand side, and a V subscript denotes a volume constraint right-hand side.

As used herein, the term "residual block vector" is defined by R=B−Ax. For example, a subvector of the residual block vector R may be expressed as:

$$R_i = \begin{bmatrix} r_1^{(i)} \\ r_2^{(i)} \\ \ldots \\ r_{m_i}^{(i)} \\ r_{m_i+1}^{(i)} \end{bmatrix} \text{ or } R_i = \begin{bmatrix} r_{M,1}^{(i)} \\ r_{M,2}^{(i)} \\ \ldots \\ r_{M,m_i}^{(i)} \\ r_V^{(i)} \end{bmatrix} \text{ or } R_i = \begin{bmatrix} R_{M,i} \\ R_{V,i} \end{bmatrix}$$

where the M subscript denotes a mass balance residual, and a V subscript denotes a volume constraint residual.

As used herein, the term "mass balance equation" is defined as a mathematical relationship between the contents of a gridcell and flow into and out of the gridcell. It is based on the assumption that material is neither generated nor lost from the system. Each chemical component in the reservoir fluids must satisfy mass balance in each gridcell. For example, for a methane component, the mass of methane in a particular gridcell at the end of a predetermined timestep must satisfy the following equation:

Mass of Methane at New Time=Mass of Methane at Old Time+Mass of Methane Flow In−Mass of Methane Flow Out A similar relationship applies for any other chemical component present in the reservoir fluids.

The mass balance equations for the entire reservoir model may be written as:

$$IM + F_M M + F_P P = B_M \qquad (1)$$

The $F_M$ and $F_P$ matrices relate to flow between gridcells. M contains the mass subvectors, P is the vector of pressures, and $B_M$ contains the mass balance right hand side subvectors. If a one-dimensional model having five gridcells is assumed, matrix $F_M$ can be written as a block tridiagonal matrix as follows:

$$F_m = \begin{bmatrix} F_{m11} & F_{m12} & & & \\ F_{m21} & F_{m22} & F_{m23} & & \\ & F_{m32} & F_{m33} & F_{m34} & \\ & & F_{m43} & F_{m44} & F_{m45} \\ & & & F_{m54} & F_{m55} \end{bmatrix}$$

where, in general, $$F_{Mij} = -\sum_i F_{Mij}$$

$F_P$ has the same structural form as $F_m$. We can write Eq. (1) as $$\begin{bmatrix} M_1 \\ M_2 \\ M_3 \\ M_4 \\ M_5 \end{bmatrix} + \begin{bmatrix} F_{M11} & F_{M12} & & & \\ F_{M21} & F_{M22} & F_{M23} & & \\ & F_{M32} & F_{M33} & F_{M34} & \\ & & F_{M43} & F_{M44} & F_{M45} \\ & & & F_{M54} & F_{M55} \end{bmatrix} \begin{bmatrix} M_1 \\ M_2 \\ M_3 \\ M_4 \\ M_5 \end{bmatrix} + F_P P = B_M$$

As used herein, the term "Frobenius norm" is defined as the square root of the sum of the squares of the coefficients in a matrix. For example, the Frobenius norm of the matrix, which is written as:

$$A = \begin{bmatrix} a_{11} & a_{12} & \cdots & a_{1n} \\ a_{21} & a_{22} & \cdots & a_{2n} \\ \cdots & \cdots & \cdots & \cdots \\ a_{m1} & a_{m2} & \cdots & a_{mn} \end{bmatrix}$$

may be expressed as:

$$\|A\|_F = \sqrt{\sum_{i=1}^{m} \sum_{j=1}^{n} a_{ij}^2}.$$

The Frobenius norm provides a useful estimate of the largest singular value in the singular value decomposition of the matrix A.

SPECIFIC EMBODIMENTS

Various specific embodiments are described below, at least some of which are also recited in the claims.

In at least one specific embodiment, a method for solving a matrix equation AX=B, wherein A represents a block sparse matrix, B represents a right hand side block vector and X represents a solution block vector, includes: receiving the block sparse matrix and the right hand side block vector; constructing a reduced transformed block sparse matrix from the block sparse matrix; constructing a reduced transformed residual block vector from the block sparse matrix and the right hand side block vector; and solving for the solution block vector using the reduced transformed block sparse matrix and the reduced transformed residual block vector.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix comprises assembling the mass change terms coefficients from a column of the block sparse matrix into a column matrix.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes assembling the mass change terms coefficients from a column of the block sparse matrix into a column matrix; and performing a singular value decomposition on the column matrix to generate a left matrix, a diagonal matrix and a right matrix.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; and performing a singular value decomposition on the column matrix to generate a left matrix, a diagonal matrix and a right matrix, wherein the diagonal matrix comprises one or more singular values arranged in ascending order.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; and discarding one or more singular values that are less than a predetermined threshold value to generate a reduced diagonal matrix. The predetermined threshold value is typically set to a quantity between 0.01 and 0.1, but other values can be used.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; and multiplying the left matrix with the reduced diagonal matrix to generate a temporary column matrix.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; multiplying the left matrix with the reduced diagonal matrix to generate a temporary column matrix having a plurality of mass change terms coefficients; and assembling the mass change terms coefficients of the temporary column matrix into one or more temporary mass change terms coefficient submatrices that correspond to the mass change terms coefficients of the column matrix.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; multiplying the left matrix with the reduced diagonal matrix to generate a temporary column matrix having a plurality of mass change terms coefficients; assembling the mass change terms coefficients of the temporary column matrix into one or more temporary mass change terms coefficient submatrices that correspond to the mass change terms coefficients of the column matrix; and premultiplying each temporary mass change terms coefficient submatrix with the transpose of the right matrix to generate a transformed temporary mass change terms coefficient submatrix.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix comprises: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; multiplying the left matrix with the reduced diagonal matrix to generate a temporary column matrix having a plurality of mass change terms coefficients; assembling the mass change terms coefficients of the temporary column matrix into one or more temporary mass change terms coefficient submatrices that correspond to the mass change terms coefficients of the column matrix; premultiplying each temporary mass change terms coefficient submatrix with the transpose of the right matrix to generate a transformed temporary mass change terms coefficient submatrix; and premultiplying each subvector containing the pressure change terms coefficients in the block sparse matrix by the transpose of the right matrix to generate a transformed pressure change terms coefficients subvector.

In a specific embodiment of the method identified above, or of a method described elsewhere herein, constructing the reduced transformed block sparse matrix further comprises constructing a transformed block sparse matrix having the same block structure and submatrix form as the block sparse matrix.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; multiplying the left matrix with the reduced diagonal matrix to generate a temporary column matrix having a plurality of mass change terms coefficients; assembling the mass change terms coefficients of the temporary column matrix into one or more temporary mass change terms coefficient submatrices that correspond to the mass change terms coefficients of the column matrix; premultiplying each temporary mass change terms coefficient submatrix with the transpose of the right matrix to generate a transformed temporary mass change terms coefficient submatrix; premultiplying each subvector containing the pressure change terms coefficients in the block sparse matrix by the transpose of the right matrix to generate a transformed pressure change terms coefficients subvector; and postmultiplying each fluid partial volumes subvector in the block sparse matrix by the right matrix to generate a transformed fluid partial volumes vector.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; multiplying the left matrix with the reduced diagonal matrix to generate a temporary column matrix having a plurality of mass change terms coefficients; assembling the mass change terms coefficients of the temporary column matrix into one or more temporary mass change terms coefficient submatrices that correspond to the mass change terms coefficients of the column matrix; premultiplying each temporary mass change terms coefficient submatrix with the transpose of the right matrix to generate a transformed temporary mass change terms coefficient submatrix; premultiplying each subvector containing the pressure change terms coefficients in the block sparse matrix by the transpose of the right matrix to generate a transformed pressure change terms coefficients subvector; postmultiplying each fluid partial volumes subvector in the block sparse matrix by the right matrix to generate a transformed fluid partial volumes vector; and constructing a transformed block sparse matrix from one or more of the transformed temporary mass change terms coefficient submatrix, the transformed pressure change terms coefficients subvector and the transformed fluid partial volumes vector.

In a specific embodiment of the method identified above, or of a method described elsewhere herein, the matrix equation represents a system of fluid flow equations in one or more dimensions having one or more pressure change terms and one or more mass change terms, wherein the block sparse matrix contains one or more coefficients of the pressure change terms and one or more coefficients of the mass change terms, and wherein constructing the reduced transformed block sparse matrix includes: assembling the mass change terms coefficients from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix; multiplying the left matrix with the reduced diagonal matrix to generate a temporary column matrix having a plurality of mass change terms coefficients; assembling the mass change terms coefficients of the temporary column matrix into one or more temporary mass change terms coefficient submatrices that correspond to the mass change terms coefficients of the column matrix; premultiplying each temporary mass change terms coefficient submatrix with the transpose of the right matrix to generate a transformed temporary mass change terms coefficient submatrix; premultiplying each subvector containing the pressure change terms coefficients in the block sparse matrix by the transpose of the right matrix to generate a transformed pressure change terms coefficients subvector; postmultiplying each fluid partial volumes subvector in the block sparse matrix by the right matrix to generate a transformed fluid partial volumes vector; constructing a transformed block sparse matrix from one or more of the transformed temporary mass change terms coefficient submatrix, the transformed pressure change terms coefficients subvector and the transformed fluid partial volumes vector; and eliminating one or more transformed fluid partial volumes that correspond to the discarded singular values in the transformed block sparse matrix to generate the reduced transformed block sparse matrix.

In a specific embodiment of the method identified above, or of a method described elsewhere herein, the Frobenius norm of the column matrix is computed, which is referred to as the column matrix norm or value. If the column matrix value is equal to or less than a predetermined threshold value, the singular value decomposition is not performed on the column matrix, the singular values are set to zero, the right matrix is set equal to the identity matrix. As a result, certain computations that use the right matrix are skipped or simplified because the right matrix is equal to the identity matrix.

In a specific embodiment of the method identified above, or of a method described elsewhere herein, the reduced transformed block sparse matrix includes one or more reduced transformed diagonal submatrices and one or more reduced transformed off-diagonal submatrices, wherein each reduced transformed diagonal submatrix includes mass change terms coefficients and pressure change terms coefficients only within the bottom $r_i+1$ rows and right most $r_i+1$ columns of each transformed diagonal submatrix.

In a specific embodiment of the method identified above, or of a method described elsewhere herein, the reduced transformed block sparse matrix includes one or more reduced transformed diagonal submatrices and one or more reduced transformed off-diagonal submatrices, wherein each reduced transformed diagonal submatrix includes mass change terms coefficients and pressure change terms coefficients only within the bottom $r_i+1$ rows and right most $r_i+1$ columns of each transformed diagonal submatrix and each reduced transformed off-diagonal submatrix includes mass change terms coefficients and pressure change terms coefficients only within the bottom $r_i+1$ rows and the right most $r_j+1$ columns of each transformed off-diagonal submatrix.

In a specific embodiment of the method identified above, or of a method described elsewhere herein, constructing the reduced transformed residual block vector includes constructing a transformed residual block vector.

In a specific embodiment of the method identified above, or of a method described elsewhere herein, constructing the transformed residual block vector includes constructing a transformed residual block vector having a transformed mass balance residual subvector and a transformed volume constraint residual subvector.

In a specific embodiment of the method identified above, or of a method described elsewhere herein, constructing the reduced transformed residual block vector includes premultiplying a mass balance residual subvector by the transpose of the right matrix to generate a transformed mass balance residual subvector.

In a specific embodiment of the method identified above, or of a method described elsewhere herein, solving for the solution block vector includes solving for a reduced transformed solution change block vector using the reduced transformed block sparse matrix and the reduced transformed residual block vector.

In a specific embodiment of the method identified above, or of a method described elsewhere herein, solving for the solution block vector includes: solving for a reduced transformed solution change block vector using the reduced transformed block sparse matrix and the reduced transformed residual block vector; and converting the reduced transformed solution change block vector to a solution change block vector.

In a specific embodiment of the method identified above, or of a method described elsewhere herein, solving for the solution block vector includes: solving for a reduced transformed solution change block vector using the reduced transformed block sparse matrix and the reduced transformed residual block vector; converting the reduced transformed solution change block vector to a solution change block vector; and adding the solution change block vector to a current estimate of the solution block vector to update the solution block vector.

In a specific embodiment of the method identified above, or of a method described elsewhere herein, solving for the solution block vector includes: solving for a reduced transformed solution change block vector using the reduced transformed block sparse matrix and the reduced transformed residual block vector; and converting the reduced transformed solution change block vector to a solution change block vector having one or more changes in mass unknowns and one or more changes in pressure unknowns.

In at least one specific embodiment, a method for solving a matrix equation AX=B, wherein A represents a block sparse matrix, B represents a right hand side block vector and X represents a solution block vector, the method includes: constructing a reduced transformed block sparse matrix from the block sparse matrix; constructing a reduced transformed residual block vector from the block sparse matrix and the right hand side block vector; solving for a reduced transformed solution change block vector using the reduced transformed block sparse matrix and the reduced transformed residual block vector; converting the reduced transformed solution change block vector to a solution change block vector having one or more changes in mass unknowns and one or more changes in pressure unknowns; and adding the solution change block vector to a current estimate of the solution block vector to update the solution block vector.

SPECIFIC EMBODIMENTS IN DRAWINGS

Specific embodiments shown in the drawings will now be described.

Figure 2:
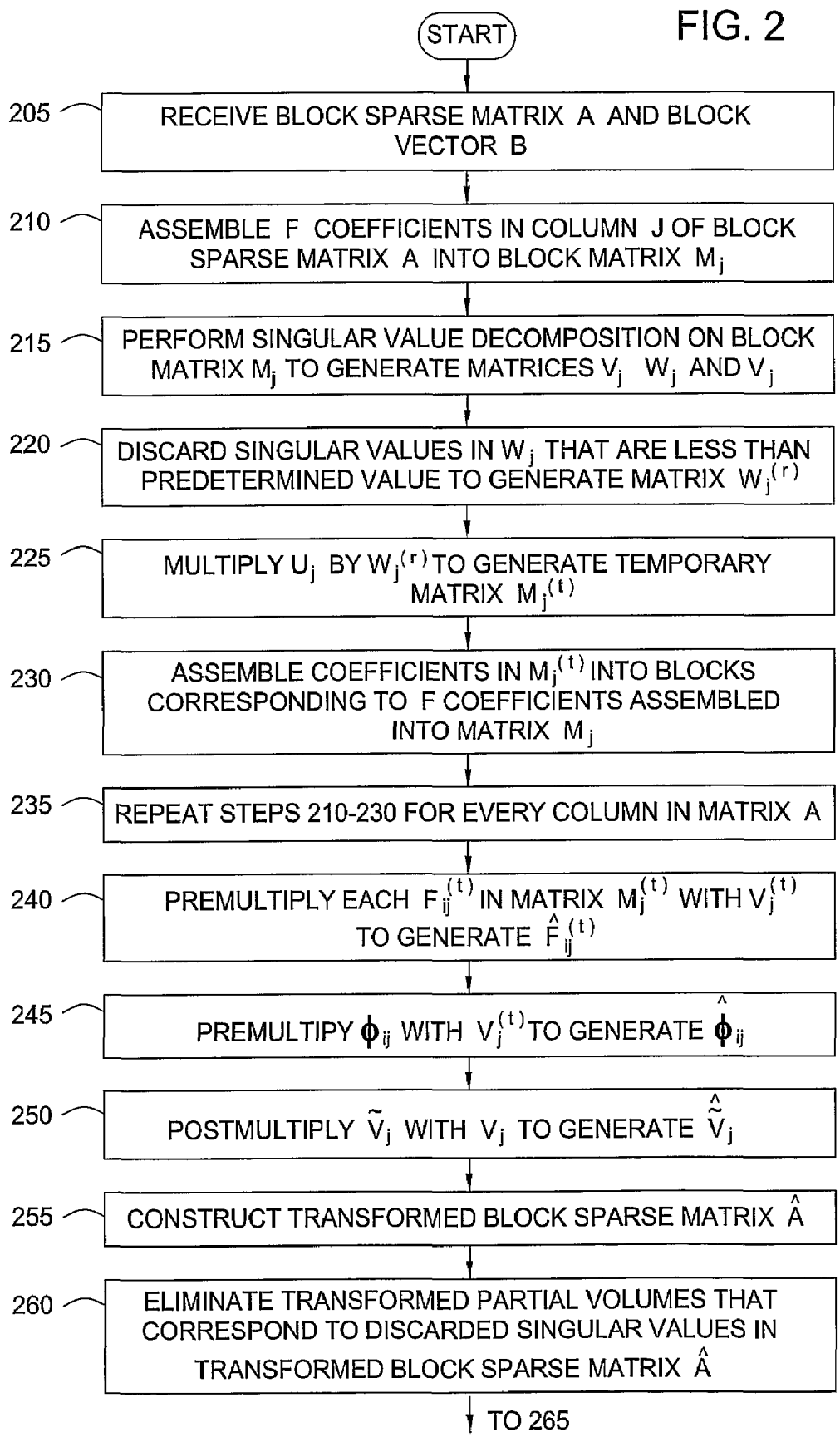
FIG. 2 illustrates a method for solving one or more linear algebraic equations in a matrix in accordance with one or more embodiments of the invention.

FIG. 2 illustrates a flow diagram of a method 200 for solving one or more linear algebraic equations in a matrix equation in accordance with one embodiment of the invention. At step 205, a block sparse matrix A and a block vector B are received. The block sparse matrix A and the block vector B are used for solving for a solution block vector X according to the implicit transport matrix equation AX=B.

At step 210, the $f$ coefficients in column j of the block sparse matrix A are assembled into a block matrix $M_j$. The $f$ coefficients that are assembled into the block matrix $M_j$ may be expressed as:

$$M_j = \begin{bmatrix} f_{11}^{(jj)} & f_{12}^{(jj)} & \cdots & f_{1,m_j}^{(jj)} \\ f_{21}^{(jj)} & f_{22}^{(jj)} & \cdots & f_{2,m_j}^{(jj)} \\ \cdots & \cdots & \cdots & \cdots \\ f_{m_j,1}^{(jj)} & f_{m_j,2}^{(jj)} & \cdots & f_{m_j,m_j}^{(jj)} \\ f_{11}^{(i_1 j)} & f_{12}^{(i_1 j)} & \cdots & f_{1,m_j}^{(i_1 j)} \\ f_{21}^{(i_1 j)} & f_{22}^{(i_1 j)} & \cdots & f_{2,m_j}^{(i_1 j)} \\ \cdots & \cdots & \cdots & \cdots \\ f_{m_{i_1},1}^{(i_1 j)} & f_{m_{i_1},2}^{(i_1 j)} & \cdots & f_{m_{i_1},m_j}^{(i_1 j)} \\ f_{11}^{(i_2 j)} & f_{12}^{(i_2 j)} & \cdots & f_{1,m_j}^{(i_2 j)} \\ f_{21}^{(i_2 j)} & f_{22}^{(i_2 j)} & \cdots & f_{2,m_j}^{(i_2 j)} \\ \cdots & \cdots & \cdots & \cdots \\ f_{m_{i_2},1}^{(i_2 j)} & f_{m_{i_2},2}^{(i_2 j)} & \cdots & f_{m_{i_2},m_j}^{(i_2 j)} \\ \cdots & \cdots & \cdots & \cdots \\ \cdots & \cdots & \cdots & \cdots \\ \cdots & \cdots & \cdots & \cdots \\ \cdots & \cdots & \cdots & \cdots \end{bmatrix}$$

or $$M_j = \begin{bmatrix} F_{jj} \\ F_{i_1 j} \\ F_{i_2 j} \\ \cdots \end{bmatrix},$$

where $F_{jj}$, $F_{ij}$, $F_{ij}$ ... are submatrices containing the $f$ coefficients in column j of the block sparse matrix A. Column j represents the first column of interest to be processed.

At step 215, a singular value decomposition is performed on the matrix Mj to generate matrices $U_j$, $W_j$, and $V_j$, where $U_j$ represents a first or left matrix containing the left singular vectors, where $W_j$ represents a second or diagonal matrix containing the singular values arranged in ascending (i.e., from small to large) order, which is in reverse of the customary order, and where $V_j$ represents a third or right matrix containing the right singular vectors. The singular value decomposition ensures that $M_j = U_j W_j V_j^T$, where $V_j^T$ is the transpose of right matrix $V_j$. The columns of left matrix $U_j$ and right matrix $V_j$ are arranged in a manner such that each entry of diagonal matrix $W_j$ is configured to multiply the appropriate column of left matrix $U_j$ and the appropriate row of transposed right matrix $V_j^T$. Left matrix $U_j$ may be expressed as:

$$U_j = \begin{bmatrix} u_{11}^{(jj)} & u_{12}^{(jj)} & \cdots & u_{1,m_j}^{(jj)} \\ u_{21}^{(jj)} & u_{22}^{(jj)} & \cdots & u_{2,m_j}^{(jj)} \\ \cdots & \cdots & \cdots & \cdots \\ u_{m_j,1}^{(jj)} & u_{m_j,2}^{(jj)} & \cdots & u_{m_j,m_j}^{(jj)} \\ u_{11}^{(i_1 j)} & u_{12}^{(i_1 j)} & \cdots & u_{1,m_j}^{(i_1 j)} \\ u_{21}^{(i_1 j)} & u_{22}^{(i_1 j)} & \cdots & u_{2,m_j}^{(i_1 j)} \\ \cdots & \cdots & \cdots & \cdots \\ u_{m_{i_1},1}^{(i_1 j)} & u_{m_{i_1},2}^{(i_1 j)} & \cdots & u_{m_{i_1},m_j}^{(i_1 j)} \\ u_{11}^{(i_2 j)} & u_{12}^{(i_2 j)} & \cdots & u_{1,m_j}^{(i_2 j)} \\ u_{21}^{(i_2 j)} & u_{22}^{(i_2 j)} & \cdots & u_{2,m_j}^{(i_2 j)} \\ \cdots & \cdots & \cdots & \cdots \\ u_{m_{i_2},1}^{(i_2 j)} & u_{m_{i_2},2}^{(i_2 j)} & \cdots & u_{m_{i_2},m_j}^{(i_2 j)} \\ \cdots & \cdots & \cdots & \cdots \\ \cdots & \cdots & \cdots & \cdots \\ \cdots & \cdots & \cdots & \cdots \\ \cdots & \cdots & \cdots & \cdots \end{bmatrix}$$

Diagonal matrix $W_j$ may be expressed as:

$$W_j = \begin{bmatrix} w_1^{(j)} & & & \\ & w_2^{(j)} & & \\ & & \cdots & \\ & & & w_{m_j}^{(j)} \end{bmatrix}$$

Right matrix $V_j$ may be expressed as:

$$V_j = \begin{bmatrix} v_{11}^{(j)} & v_{12}^{(j)} & \cdots & v_{1,m_j}^{(j)} \\ v_{21}^{(j)} & v_{22}^{(j)} & \cdots & v_{2,m_j}^{(j)} \\ \cdots & \cdots & \cdots & \cdots \\ v_{m_j,1}^{(j)} & v_{m_j,2}^{(j)} & \cdots & v_{m_j,m_j}^{(j)} \end{bmatrix}$$

A more detailed description of the singular value decomposition is provided in the definition section above. It should be noted that to enhance the method, the Frobenius norm of the matrix $M_j$ may be computed in block 215. The calculated Frobenius norm may be referred to as the column matrix norm. If the Frobenius norm is greater than a predetermined threshold value, the singular value decomposition is performed on the matrix $M_j$ to generate matrices $U_j$, $W_j$, and $V_j$, as noted above. However, if the Frobenius norm is not larger than the predetermined matrix value, $V_j$ is set equal to the identity matrix, the entries of $W_j$ are set to zero, and the entries of $U_j$ are not computed. That is, the method reduces the computations because the entries of $U_j$ do not influence the outcome. Accordingly, the method is enhanced because certain computations are skipped or simplified.

At step 220, the singular values in diagonal matrix $W_j$ that are smaller than a predetermined threshold value are discarded to generate reduced diagonal matrix $W_j^{(r)}$. In one embodiment, the singular values are discarded by setting them to zero. The number of remaining (or retained) singular values in diagonal matrix $W_j$ that have not been discarded may be referred to as $r_j$. As such, reduced diagonal matrix $w_j^{(r)}$ may be expressed as:

$$W_j^{(r)} = \begin{bmatrix} 0 & & & & & \\ & \ldots & & & & \\ & & 0 & & & \\ & & & w_{m_j+1-r_j}^{(j)} & & \\ & & & & \ldots & \\ & & & & & w_{m_j}^{(j)} \end{bmatrix}$$

At step 225, left matrix $U_j$ is multiplied by reduced diagonal matrix $W_j^{(r)}$ to generate a temporary column matrix $M_j^{(t)}$. The right $r_j$ columns of temporary column matrix $M_j^{(t)}$ contain nonzero entries and the rest of the entries of temporary column matrix $M_j^{(t)}$ are zeroes. Temporary column matrix $M_j^{(t)}$ may be expressed as:

$$M_j^{(t)} = \begin{bmatrix} 0 & \cdots & 0 & w_{m_j+1-r_j}^{(j)} u_{1,m_j+1-r_j}^{(jj)} & \cdots & w_{m_j}^{(j)} u_{1,m_j}^{(jj)} \\ 0 & \cdots & 0 & w_{m_j+1-r_j}^{(j)} u_{2,m_j+1-r_j}^{(jj)} & \cdots & w_{m_j}^{(j)} u_{2,m_j}^{(jj)} \\ \cdots & \cdots & \cdots & \cdots & \cdots & \cdots \\ 0 & \cdots & 0 & w_{m_j+1-r_j}^{(j)} u_{m_j,m_j+1-r_j}^{(jj)} & \cdots & w_{m_j}^{(j)} u_{m_j,m_j}^{(jj)} \\ 0 & \cdots & 0 & w_{m_j+1-r_j}^{(j)} u_{1,m_j+1-r_j}^{(i_1 j)} & \cdots & w_{m_j}^{(j)} u_{1,m_j}^{(i_1 j)} \\ 0 & \cdots & 0 & w_{m_j+1-r_j}^{(j)} u_{2,m_j+1-r_j}^{(i_1 j)} & \cdots & w_{m_j}^{(j)} u_{2,m_j}^{(i_1 j)} \\ \cdots & \cdots & \cdots & \cdots & \cdots & \cdots \\ 0 & \cdots & 0 & w_{m_j+1-r_j}^{(j)} u_{m_{i_1},m_j+1-r_j}^{(i_1 j)} & \cdots & w_{m_j}^{(j)} u_{m_{i_1},m_j}^{(i_1 j)} \\ 0 & \cdots & 0 & w_{m_j+1-r_j}^{(j)} u_{1,m_j+1-r_j}^{(i_2 j)} & \cdots & w_{m_j}^{(j)} u_{1,m_j}^{(i_2 j)} \\ 0 & \cdots & 0 & w_{m_j+1-r_j}^{(j)} u_{2,m_j+1-r_j}^{(i_2 j)} & \cdots & w_{m_j}^{(j)} u_{2,m_j}^{(i_2 j)} \\ \cdots & \cdots & \cdots & \cdots & \cdots & \cdots \\ 0 & \cdots & 0 & w_{m_j+1-r_j}^{(j)} u_{m_{i_2},m_j+1-r_j}^{(i_2 j)} & \cdots & w_{m_j}^{(j)} u_{m_{i_2},m_j}^{(i_2 j)} \\ \cdots & \cdots & \cdots & \cdots & \cdots & \cdots \\ \cdots & \cdots & \cdots & \cdots & \cdots & \cdots \\ \cdots & \cdots & \cdots & \cdots & \cdots & \cdots \end{bmatrix}$$

At step 230, the coefficients in temporary column matrix $M_j^{(t)}$ are assembled into blocks corresponding to the original set of submatrices (e.g., $F_{ij}$) containing the $f$ coefficients in column $j$ of the block sparse matrix A that were assembled into matrix $M_j$. That is, temporary column matrix $M_j^{(t)}$ may be expressed as:

$$M_j^{(t)} = \begin{bmatrix} F_{jj}^{(t)} \\ F_{i_1 j}^{(t)} \\ F_{i_2 j}^{(t)} \\ \cdots \end{bmatrix},$$

where temporary submatrices $F_{ij}^{(t)}$ may be expressed as:

$$F_{ij}^{(t)} = \begin{bmatrix} 0 & \cdots & 0 & w_{m_j+1-r_j}^{(j)} u_{1,m_j+1-r_j}^{(ij)} & \cdots & w_{m_j}^{(j)} u_{1,m_j}^{(ij)} \\ 0 & \cdots & 0 & w_{m_j+1-r_j}^{(j)} u_{2,m_j+1-r_j}^{(ij)} & \cdots & w_{m_j}^{(j)} u_{2,m_j}^{(ij)} \\ \cdots & \cdots & \cdots & \cdots & \cdots & \cdots \\ 0 & \cdots & 0 & w_{m_j+1-r_j}^{(j)} u_{m_i,m_j+1-r_j}^{(ij)} & \cdots & w_{m_j}^{(j)} u_{m_i,m_j}^{(ij)} \end{bmatrix}.$$

At step 235, steps 210 through 230 are repeated for the rest of the columns in block sparse matrix A to obtain the rest of temporary column matrices in the block sparse matrix A.

At step 240, for each i for which $V_i$ is not an identity matrix the temporary submatrix $F_{ij}^{(t)}$ in temporary column matrix $M_j^{(t)}$ is premultiplied by transposed right matrix $V_i^T$ to generate a transformed version of submatrix $F_{ij}^{(t)}$. The product may be expressed as: $\hat{F}_{ij}^{(t)} = V_i^T F_{ij}^{(t)}$. For each i with $V_i$ being an identity matrix, the product is $\hat{F}_{ij}^{(t)} = F_{ij}^{(t)}$.

At step 245, for each i for which $V_i$ is not an identity matrix the subvector $\Phi_{ij}$ containing $\phi$ coefficients from submatrix $A_{ij}$ is premultiplied by transposed right matrix $V_i^T$ to generate a transformed version of subvector $\Phi_{ij}$. The product may be expressed as: $\hat{\Phi}_{ij} = V_j^T \Phi_{ij}$. For each i with $V_i$ being an identity matrix, the product is $\hat{\Phi}_{ij} = \Phi_{ij}$.

At step 250, for each j for which $\tilde{V}_j$ is not an identity matrix the fluid partial volumes vector $\tilde{V}_j$ is postmultiplied by $V_j$ to generate a transformed version of fluid partial volumes vector $\hat{V}_j$. The product may be expressed as: $\hat{V}_j = \tilde{V}_j V_j$. For each j with $V_j$ being an identity matrix, the product is $\hat{V} = \tilde{V}j$.

At step 255, a transformed block sparse matrix $\hat{A}$ having the same block structure and submatrix form as block sparse matrix A is constructed. As such, the transformed off diagonal submatrix $\hat{A}_{ij}$, where $i \neq j$, may be expressed as:

$$\hat{A}_{ij} = \begin{bmatrix} \hat{F}_{ij}^{(t)} & \hat{\Phi}_{ij} \\ 0 & 0 \end{bmatrix}$$

The transformed diagonal submatrix $\hat{A}_{ii}$ may be expressed as:

$$\hat{A}_{ii} = \begin{bmatrix} I + \hat{F}_{ii}^{(t)} & \hat{\Phi}_{ii} \\ \hat{V}_i & c_i \end{bmatrix}$$

or $$\hat{A}_{ii} = \begin{bmatrix} 1 & \cdots & 0 & \hat{f}_{1,m_i+1-r_i}^{(ii)} & \cdots & \hat{f}_{1,m_i}^{(ii)} & \hat{\varphi}_1^{(ii)} \\ \cdots & \cdots & \cdots & \cdots & \cdots & \cdots & \cdots \\ 0 & \cdots & 1 & \hat{f}_{m_i-r_i,m_i+1-r_i}^{(ii)} & \cdots & \hat{f}_{m_i-r_i,m_i}^{(ii)} & \hat{\varphi}_{m_i-r_i}^{(ii)} \\ 0 & \cdots & 0 & 1 + \hat{f}_{m_i+1-r_i,m_i+1-r_i}^{(ii)} & \cdots & \hat{f}_{m_i+1-r_i,m_i}^{(ii)} & \hat{\varphi}_{m_i+1-r_i}^{(ii)} \\ \cdots & \cdots & \cdots & \cdots & \cdots & \cdots & \cdots \\ 0 & \cdots & 0 & \hat{f}_{m_i,m_i+1-r_i}^{(ii)} & \cdots & 1 + \hat{f}_{m_i,m_i}^{(ii)} & \hat{\varphi}_{m_i}^{(ii)} \\ \hat{v}_1^{(i)} & \cdots & \hat{v}_{m_i-r_i}^{(i)} & \hat{v}_{m_i+1-r_i}^{(i)} & \cdots & \hat{v}_{m_i}^{(i)} & c_i \end{bmatrix}$$

At step 260, the transformed partial volumes that correspond to the discarded singular values in transformed block sparse matrix $\hat{A}$ are eliminated. In one embodiment, the transformed partial volumes $\hat{V}_1^{(i)}, \ldots, \hat{V}_{m_i-r_i}^{(i)}$ that correspond to the discarded singular values in the transformed diagonal submatrix $\hat{A}_{ii}$ are eliminated by multiplying $\tilde{V}_k^{(i)}$ by $\hat{f}_{k,m_i+1-r_i}^{(ii)}, \ldots, \hat{f}_{k,m_i}^{(ii)}, \hat{\phi}_k^{(ii)}$ and subtracting the result from $\tilde{V}_{m_i+1-r_i}^{(i)}, \ldots, \tilde{V}_{m_i}^{(i)}, c_i$, where $k=1, \ldots, m_i-r_i$. A similar operation is performed on the transformed off diagonal submatrix $\hat{A}_{ij}$ by multiplying the transformed partial volumes $\tilde{V}_k^{(i)}$ with $\hat{f}_{k,m_i+1-r_j}^{(ij)}, \ldots, \hat{f}_{k,m_j}^{(ij)}, \hat{\phi}_k^{(ij)}$ and subtracting the result from the bottom row of the transformed off diagonal submatrix $\hat{A}_{ij}$. The elimination process may be repeated for all rows of transformed block sparse matrix $\hat{A}$. Once the transformed partial volumes that correspond to the discarded singular values in transformed block sparse matrix $\hat{A}$ are eliminated, the transformed diagonal submatrix $\hat{A}_{ii}$ may be expressed as:

$$\hat{A}_{ii} = \begin{bmatrix} 1 & \cdots & 0 & \hat{f}_{1,m_i+1-r_i}^{(ii)} & \cdots & \hat{f}_{1,m_i}^{(ii)} & \hat{\varphi}_1^{(ii)} \\ \cdots & \cdots & \cdots & \cdots & \cdots & \cdots & \cdots \\ 0 & \cdots & 1 & \hat{f}_{m_i-r_i,m_i+1-r_i}^{(ii)} & \cdots & \hat{f}_{m_i-r_i,m_i}^{(ii)} & \hat{\varphi}_{m_i-r_i}^{(ii)} \\ 0 & \cdots & 0 & 1+\hat{f}_{m_i+1-r_i,m_i+1-r_i}^{(ii)} & \cdots & \hat{f}_{m_i+1-r_i,m_i}^{(ii)} & \hat{\varphi}_{m_i+1-r_i}^{(ii)} \\ \cdots & \cdots & \cdots & \cdots & \cdots & \cdots & \cdots \\ 0 & \cdots & 0 & \hat{f}_{m_i,m_i+1-r_i}^{(ii)} & \cdots & 1+\hat{f}_{m_i,m_i}^{(ii)} & \hat{\varphi}_{m_i}^{(ii)} \\ 0 & \cdots & 0 & \hat{f}_{m_i+1,m_i+1-r_i}^{(ii)} & \cdots & \hat{f}_{m_i+1,m_i}^{(ii)} & \hat{\varphi}_{m_i+1}^{(ii)} \end{bmatrix}$$

The transformed off diagonal submatrix $\hat{A}_{ij}$, where $i \neq j$, may be expressed as:

$$\hat{A}_{ij} = \begin{bmatrix} 0 & \cdots & 0 & \hat{f}_{1,m_j+1-r_j}^{(ij)} & \cdots & \hat{f}_{1,m_j}^{(ij)} & \hat{\varphi}_1^{(ij)} \\ \cdots & \cdots & \cdots & \cdots & \cdots & \cdots & \cdots \\ 0 & \cdots & 0 & \hat{f}_{m_i-r_i,m_j+1-r_j}^{(ij)} & \cdots & \hat{f}_{m_i-r_i,m_j}^{(ij)} & \hat{\varphi}_{m_i-r_i}^{(ij)} \\ 0 & \cdots & 0 & \hat{f}_{m_i+1-r_i,m_j+1-r_j}^{(ij)} & \cdots & \hat{f}_{m_i+1-r_i,m_j}^{(ij)} & \hat{\varphi}_{m_i+1-r_i}^{(ij)} \\ \cdots & \cdots & \cdots & \cdots & \cdots & \cdots & \cdots \\ 0 & \cdots & 0 & \hat{f}_{m_i,m_j+1-r_j}^{(ij)} & \cdots & \hat{f}_{m_i,m_j}^{(ij)} & \hat{\varphi}_{m_i}^{(ij)} \\ 0 & \cdots & 0 & \hat{f}_{m_i+1,m_j+1-r_j}^{(ij)} & \cdots & \hat{f}_{m_i+1,m_j}^{(ij)} & \hat{\varphi}_{m_i+1}^{(ij)} \end{bmatrix}$$

At step 265, a reduced transformed block sparse matrix $\hat{A}^{(r)}$ is constructed. In the reduced transformed diagonal submatrices $\hat{A}_{ii}^{(r)}$ of the reduced transformed block sparse matrix $\hat{A}^{(r)}$, the bottom $r_i+1$ rows contain nonzero coefficients in only the right most $r_i+1$ columns. These coefficients are placed in a matrix of smaller dimension, resulting in the reduced transformed diagonal submatrix $\hat{A}_{ii}^{(r)}$ which may be expressed as:

$$\hat{A}_{ii}^{(r)} = \begin{bmatrix} 1+\hat{f}_{m_i+1-r_i,m_i+1-r_i}^{(ii)} & \cdots & \hat{f}_{m+1-r_i,m_i}^{(ii)} & \hat{\varphi}_{m_i+1-r_i}^{(ii)} \\ \cdots & \cdots & \cdots & \cdots \\ \hat{f}_{m_i,m_i+1-r_i}^{(ii)} & \cdots & 1+\hat{f}_{m_i,m_i}^{(ii)} & \hat{\varphi}_{m_i}^{(ii)} \\ \hat{f}_{m_i+1,m_i+1-r_i}^{(ii)} & \cdots & \hat{f}_{m_i+1,m_i}^{(ii)} & \hat{\varphi}_{m_i+1}^{(ii)} \end{bmatrix}$$

The reduced transformed off-diagonal submatrices $\hat{A}_{ij}^{(r)}$ for the reduced transformed block sparse matrix $\hat{A}^{(r)}$ contain only coefficients within the bottom $r_i+1$ rows and the right most $r_j+1$ columns. As such, the reduced transformed off diagonal submatrix $\hat{A}_{ij}^{(r)}$ may be expressed as:

$$\hat{A}_{ij}^{(r)} = \begin{bmatrix} \hat{f}_{m_i+1-r_i,m_j+1-r_j}^{(ij)} & \cdots & \hat{f}_{m_i+1-r_i,m_j}^{(ij)} & \hat{\varphi}_{m_i+1-r_i}^{(ij)} \\ \cdots & \cdots & \cdots & \cdots \\ \hat{f}_{m_i,m_j+1-r_j}^{(ij)} & \cdots & \hat{f}_{m_i,m_j}^{(ij)} & \hat{\varphi}_{m_i}^{(ij)} \\ \hat{f}_{m_i+1,m_j+1-r_j}^{(ij)} & \cdots & \hat{f}_{m_i+1,m_j}^{(ij)} & \hat{\varphi}_{m_i+1}^{(ii)} \end{bmatrix}$$

At step 270, the residual block vector R is initialized by setting it equal to the right-hand side vector B. That is, the initial residual block vector $R^{(0)}$ is set equal to the right-hand side vector B.

At step 275, a transformed residual block vector $\hat{R}_i$ is constructed. The transformed residual block vector $\hat{R}_i$ may be expressed as:

$$\hat{R}_i = \begin{bmatrix} \hat{R}_{M,i} \\ \hat{R}_{V,i} \end{bmatrix}.$$

The transformed mass balance residual subvector $\hat{R}_{M,i}$ may be expressed as: $\hat{R}_{M,i} = V_i^T R_{M,i}^{(0)}$. The transformed volume constraint residual subvector $\hat{R}_{V,i}$ may be computed by multiplying the transformed partial volumes $\tilde{V}_k^{(i)}$ that correspond to the discarded singular values in the transformed block sparse matrix $\hat{A}$ with $\hat{r}_k^{(i)}$ and subtracting the result from the volume constraint residual subvector $R_{V,i}$, where $k=1, \ldots, m_i-r_i-1$.

At step 280, a reduced transformed residual block vector block vector $\hat{R}^{(r)}$ is constructed and expressed as:

$$\hat{R}_i^{(r)} = \begin{bmatrix} \hat{r}_{m_i+1-r_i}^{(i)} \\ \cdots \\ \hat{r}_{m_i}^{(i)} \\ \hat{r}_{m_i+1}^{(i)} \end{bmatrix}$$

where the values of the reduced transformed residual block vector block vector $\hat{R}^{(r)}$ are obtained from the transformed mass balance residual sub vector $\hat{R}_{M,i}$.

At step 282, the matrix equation $\hat{A}^{(r)} \delta \hat{X}^{(r)} = \hat{R}^{(r)}$ is solved for a reduced transformed solution change block vector $\delta \hat{X}^{(r)}$, which contains a reduced set of mass and pressure unknowns.

At step 284, a partial transformed solution change vector $\delta \hat{X}^{(0)}$ is created by setting each subvector as follows:

$$\delta \hat{X}_i^{(0)} = \begin{bmatrix} 0 \\ \cdots \\ 0 \\ \delta \hat{x}_{m_i+1-r_i}^{(r,i)} \\ \cdots \\ \delta \hat{x}_{m_i}^{(r,i)} \\ \delta \hat{p}^{(i)} \end{bmatrix}$$

The zeroes correspond to the discarded singular values.

At step 286, a transformed residual block vector $\hat{R}^{(0)}$ is computed using the partial transformed solution change vector $\delta\hat{X}^{(0)}$ and the following equation:

$$\hat{R}^{(0)} = \hat{R} - \hat{A}\delta\hat{X}^{(0)}$$

At step 288, the values of the transformed solution change vector $\delta\hat{X}_i$ are constructed as follows:

$$\delta\hat{X}_i = \begin{bmatrix} \hat{r}_1^{(0,i)} \\ \ldots \\ \hat{r}_{m_i-r_i}^{(0,i)} \\ \delta\hat{x}_{m_i+1-r_i}^{(r,i)} \\ \ldots \\ \delta\hat{x}_{m_i}^{(r,i)} \\ \delta\hat{p}^{(i)} \end{bmatrix},$$

where the values in the lower half of the transformed solution change vector $\delta\hat{X}_i$ are obtained from the lower half of the partial transformed solution change vector $\delta\hat{X}^{(0)}$ and values in the upper half of the transformed solution change vector $\delta\hat{X}_i$ are obtained from the transformed residual block vector $\hat{R}^{(0)}$ determined at step 286.

At 290, the mass changes $\delta M_i$ are computed according to $\delta M_i = V_i X_{m,i}$, where $V_i$ represents the matrix containing the right singular vectors, as previously described with reference to step 215 and $\delta X_{m,i}$ represents a vector containing only the mass unknown entries in $\delta\hat{X}_i$. At step 292, the mass changes $\delta M_i$ are then used to assemble a solution change block subvector $\delta X_i$ as follows:

$$\delta X_i = \begin{bmatrix} \delta M_i \\ \delta P_i \end{bmatrix}$$

At step 294, the solution change subvector $\delta X_i$ is then used to update the solution subvector $X_i$ as follows $X_i = X_i + \delta X_i$. At step 296, steps 290-294 are repeated for each subvector of X. In this manner, an estimate for the current solution block vector X is computed.

At step 297, an updated residual block vector R is computed according to $R = B - AX$. At step 298, a determination is made as to whether the updated residual block vector R and the solution block vector X have satisfied a predetermined stopping criteria. If the answer is in the negative, processing returns to step 275. If the answer is in the affirmative, then processing ends.

Figure 3:
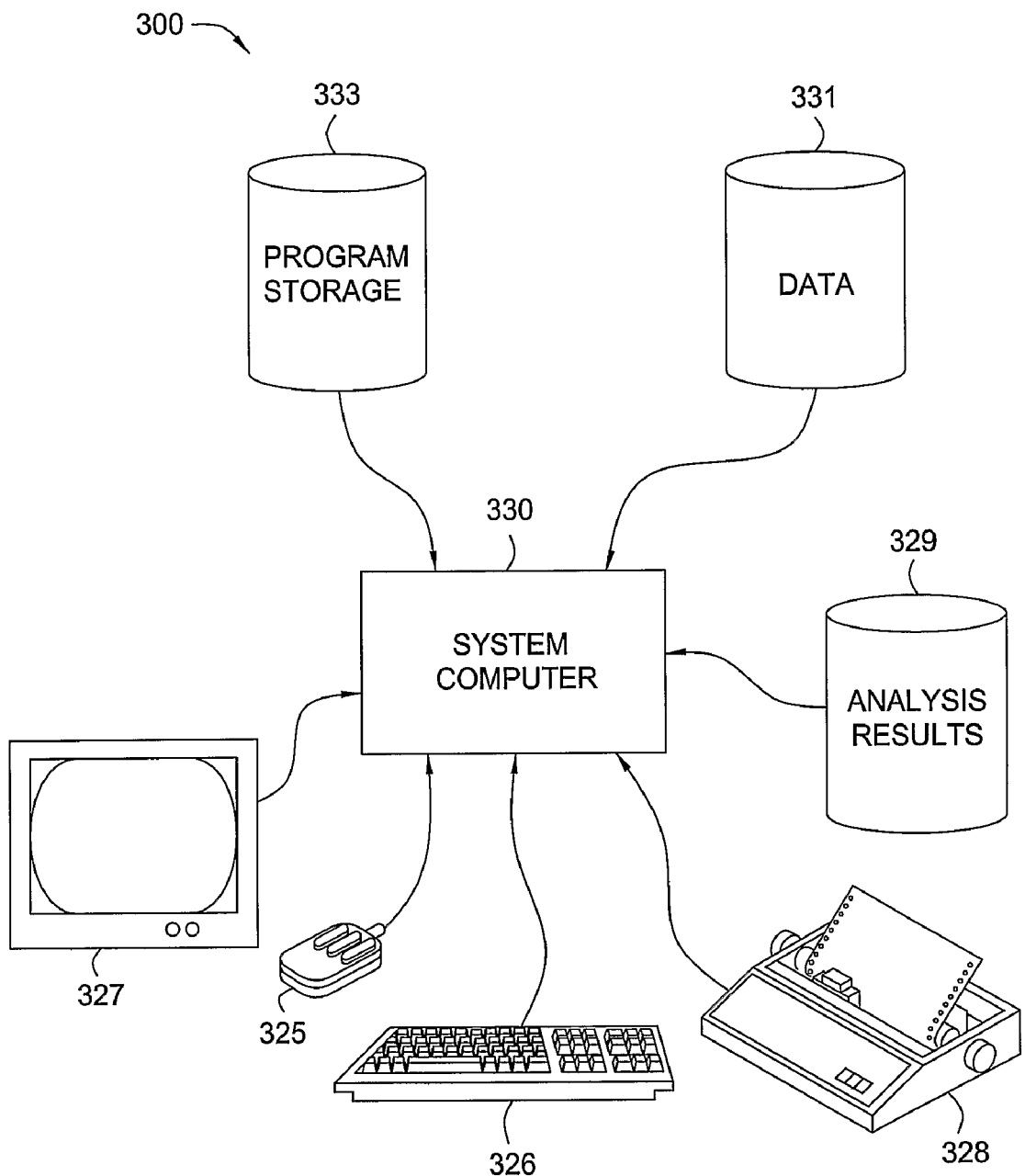
FIG. 3 illustrates a computer network into which one or more embodiments of the invention may be implemented.

FIG. 3 illustrates a computer network 300, into which embodiments of the invention may be implemented. The computer network 300 includes a system computer 330, which may be implemented as any conventional personal computer or workstation, such as a UNIX-based workstation. The system computer 330 is in communication with disk storage devices 329, 331, and 333, which may be external hard disk storage devices. It is contemplated that disk storage devices 329, 331, and 333 are conventional hard disk drives, and as such, will be implemented by way of a local area network or by remote access. Of course, while disk storage devices 329, 331, and 333 are illustrated as separate devices, a single disk storage device may be used to store any and all of the program instructions, measurement data, and results as desired.

In one embodiment, the input data are stored in disk storage device 331. The system computer 330 may retrieve the appropriate data from the disk storage device 331 to solve the implicit reservoir simulation matrix equation according to program instructions that correspond to the methods described herein. The program instructions may be written in a computer programming language, such as C++, Java and the like. The program instructions may be stored in a computer-readable memory, such as program disk storage device 333. Of course, the memory medium storing the program instructions may be of any conventional type used for the storage of computer programs, including hard disk drives, floppy disks, CD-ROMs and other optical media, magnetic tape, and the like.

According to a preferred embodiment, the system computer 330 presents output primarily onto graphics display 327, or alternatively via printer 328. The system computer 230 may store the results of the methods described above on disk storage 329, for later use and further analysis. The keyboard 326 and the pointing device (e.g., a mouse, trackball, or the like) 225 may be provided with the system computer 330 to enable interactive operation.

The system computer 330 may be located at a data center remote from the reservoir. While FIG. 3 illustrates the disk storage 331 as directly connected to the system computer 330, it is also contemplated that the disk storage device 331 may be accessible through a local area network or by remote access. Furthermore, while disk storage devices 329, 331 are illustrated as separate devices for storing input data and analysis results, the disk storage devices 329, 331 may be implemented within a single disk drive (either together with or separately from program disk storage device 333), or in any other conventional manner as will be fully understood by one of skill in the art having reference to this specification.

What is claimed is:

1. A computer-implemented method for simulating fluid flow in a hydrocarbon reservoir, the method comprising:
   constructing a system of fluid flow equations relating to the hydrocarbon reservoir;
   representing the system of fluid flow equations as a matrix equation AX=B, wherein A represents a block sparse matrix, B represents a right hand side block vector, and X represents a solution block vector;
   receiving the block sparse matrix and the right hand side block vector;
   constructing a reduced transformed block sparse matrix from the block sparse matrix;
   constructing a reduced transformed residual block vector from the block sparse matrix and the right hand side block vector; wherein constructing the reduced transformed block sparse matrix comprises:
      assembling one or more coefficients of one or more mass change terms from a column of the block sparse matrix into a column matrix;
      performing a singular value decomposition on the column matrix to generate a left matrix, a diagonal matrix and a right matrix; and
      discarding one or more singular values that are less than a predetermined threshold value to generate a reduced diagonal matrix;
   solving for the solution block vector using the reduced transformed block sparse matrix and the reduced transformed residual block vector simulating fluid flow rate in the hydrocarbon reservoir based on the solution block vector; and
   displaying, on a display, results of fluid flow rates for the reservoir simulation based on the solution block vector.

2. The method of claim 1, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms.

3. The method of claim 1, wherein constructing the reduced transformed block sparse matrix further comprises constructing a transformed block sparse matrix having the same block structure and submatrix form as the block sparse matrix.

4. The method of claim 1, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms, and wherein the diagonal matrix comprises one or more singular values arranged in ascending order.

5. The method of claim 1, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms, and wherein constructing the reduced transformed block sparse matrix comprises multiplying the left matrix by the reduced diagonal matrix to generate a temporary column matrix.

6. The method of claim 1, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms, and wherein constructing the reduced transformed block sparse matrix comprises:
   multiplying the left matrix by the reduced diagonal matrix to generate a temporary column matrix having a plurality of mass change terms coefficients; and
   assembling the mass change terms coefficients of the temporary column matrix into one or more temporary mass change terms coefficient submatrices that correspond to the mass change terms coefficients of the column matrix.

7. The method of claim 6, wherein constructing the reduced transformed block sparse matrix comprises premultiplying each temporary mass change terms coefficient submatrix by the transpose of the right matrix to generate a transformed temporary mass change terms coefficient submatrix.

8. The method of claim 7, wherein constructing the reduced transformed block sparse matrix comprises premultiplying each subvector containing the pressure change terms coefficients in the block sparse matrix by the transpose of the right matrix to generate a transformed pressure change terms coefficients subvector.

9. The method of claim 8, wherein constructing the reduced transformed block sparse matrix comprises postmultiplying each fluid partial volumes subvector in the block sparse matrix by the right matrix to generate a transformed fluid partial volumes vector.

10. The method of claim 9, wherein constructing the reduced transformed block sparse matrix comprises constructing a transformed block sparse matrix from one or more of the transformed temporary mass change terms coefficient submatrix, the transformed pressure change terms coefficients subvector and the transformed fluid partial volumes vector.

11. The method of claim 10, wherein constructing the reduced transformed block sparse matrix comprises eliminating one or more transformed fluid partial volumes that correspond to the discarded singular values in the transformed block sparse matrix to generate the reduced transformed block sparse matrix.

12. The method of claim 1, wherein constructing the reduced transformed block sparse matrix comprises:
   determining a column matrix norm for the column matrix;
   skipping the singular value decomposition if the column matrix norm is equal to or less than the predetermined threshold value;
   setting the singular values to zero if the column matrix norm is equal to or less than the predetermined threshold value; and
   setting the right matrix to the identity matrix if the column matrix norm is equal to or less than the predetermined threshold value.

13. The method of claim 12, wherein determining the column matrix norm comprises calculating the Frobenius norm of the column matrix.

14. The method of claim 1, wherein the reduced transformed block sparse matrix comprises one or more reduced transformed diagonal submatrices and one or more reduced transformed off-diagonal submatrices, wherein each reduced transformed diagonal submatrix comprises mass change terms coefficients and pressure change terms coefficients only within the bottom $r_i+1$ rows and right most $r_i+1$ columns of each transformed diagonal submatrix.

15. The method of claim 14, wherein each reduced transformed off-diagonal submatrix comprises mass change terms coefficients and pressure change terms coefficients only within the bottom $r_i+1$ rows and the right most $r_j+1$ columns of each transformed off-diagonal submatrix.

16. The method of claim 1, wherein constructing the reduced transformed residual block vector comprises constructing a transformed residual block vector.

17. The method of claim 1, wherein constructing the transformed residual block vector comprises constructing a transformed residual block vector having a transformed mass balance residual subvector and a transformed volume constraint residual subvector.

18. The method of claim 1, wherein constructing the reduced transformed residual block vector comprises premultiplying a mass balance residual subvector by the transpose of the right matrix to generate a transformed mass balance residual subvector.

19. The method of claim 1, wherein solving for the solution block vector comprises solving for a reduced transformed solution change block vector using the reduced transformed block sparse matrix and the reduced transformed residual block vector.

20. The method of claim 1, wherein solving for the solution block vector comprises:
   solving for a reduced transformed solution change block vector using the reduced transformed block sparse matrix and the reduced transformed residual block vector; and
   converting the reduced transformed solution change block vector to a solution change block vector.

21. The method of claim 1, wherein solving for the solution block vector comprises:
   adding the solution change block vector to a current estimate of the solution block vector to update the solution block vector.

22. The method of claim 1, wherein solving for the solution block vector comprises:

solving for a reduced transformed solution change block vector using the reduced transformed block sparse matrix and the reduced transformed residual block vector; and converting the reduced transformed solution change block vector to a solution change block vector having one or more changes in mass unknowns and one or more changes in pressure unknowns.

23. A computer-implemented method for solving a matrix equation AX=B that represents a system of fluid flow equations, wherein A represents a block sparse matrix, B represents a right hand side block vector and X represents a solution block vector, the method comprising:

constructing a reduced transformed block sparse matrix from the block sparse matrix;

constructing a reduced transformed residual block vector from the block sparse matrix and the right hand side block vector wherein constructing the reduced transformed block sparse matrix comprises: assembling one or more coefficients of one or more mass change terms from a column of the block sparse matrix into a column matrix; performing a singular value decomposition on the column matrix to generate a left matrix, a diagonal matrix and a right matrix; discarding one or more singular values that are less than a predetermined threshold value to generate a reduced diagonal matrix;

solving for a reduced transformed solution change block vector using the reduced transformed block sparse matrix and the reduced transformed residual block vector;

converting the reduced transformed solution change block vector to a solution change block vector having one or more changes in mass unknowns and one or more changes in pressure unknowns;

adding the solution change block vector to a current estimate of the solution block vector to update the solution block vector simulating fluid flow rate in the hydrocarbon reservoir based on the solution block vector; and displaying on a display, results of fluid flow rates for the reservoir simulation based on the solution block vector.

24. A computer-implemented method for solving a matrix equation AX=B in a hydrocarbon reservoir simulation, wherein A represents a block sparse matrix, B represents a first block vector and X represents a solution block vector, the method comprising:

receiving the block sparse matrix and the first block vector;

constructing a reduced transformed block sparse matrix from the block sparse matrix;

constructing a reduced transformed residual block vector from the block sparse matrix and the first block vector; wherein constructing the reduced transformed block sparse matrix comprises:

assembling at least one coefficient associated with the at least one mass change term from a column of the block sparse matrix into a column matrix;

performing a singular value decomposition on the column matrix to generate a first matrix, a second matrix and a third matrix; and discarding each singular value less than a predetermined threshold value to generate a reduced diagonal matrix;

solving for the solution block vector using the reduced transformed block sparse matrix and the reduced transformed residual block vector simulating fluid flow rate in the hydrocarbon reservoir based on the solution block vector; and outputting results of fluid flow rates for the reservoir simulation based on the solution block vector.

25. The method of claim 24, wherein the matrix equation represents fluid flow equations in a reservoir having at least one pressure change term and at least one mass change term, wherein the block sparse matrix has at least one coefficient associated with the at least one pressure change term and at least one coefficient associated with the at least one mass change term.

26. The method of claim 24, wherein constructing the reduced transformed block sparse matrix comprises:

determining a column matrix norm for the column matrix;

skipping the singular value decomposition if the column matrix norm is equal to or less than a predetermined threshold value;

setting the singular values to zero if the column matrix norm is equal to or less than the predetermined threshold value; and setting the third matrix to the identity matrix if the column matrix norm is equal to or less than the predetermined matrix threshold.

27. The method of claim 26, wherein determining the column matrix norm comprises calculating the Frobenius norm of the column matrix.

28. A system comprising:

a computer;

program instructions executed by the computer and configured to:

receive a block sparse matrix and a right hand side block vector for a matrix equation AX=B that represents a system of fluid flow equations in a hydrocarbon reservoir, wherein A represents the block sparse matrix, B represents the right hand side block vector and X represents a solution block vector;

construct a reduced transformed block sparse matrix from the block sparse matrix;

construct a reduced transformed residual block vector from the block sparse matrix and the right hand side block vector; wherein to construct the reduced transformed block sparse matrix the program instructions are configured to assemble one or more coefficients of one or more mass change terms from a column of the block sparse matrix into a column matrix, perform a singular value decomposition on the column matrix to generate a left matrix, a diagonal matrix and a right matrix, discard one or more singular values that are less than a predetermined threshold value to generate a reduced diagonal matrix, and solve for the solution block vector using the reduced transformed block sparse matrix and the reduced transformed residual block vector simulate fluid flow rate in the hydrocarbon reservoir based on the solution block vector; and a graphics display coupled to the computer and configured to display results based on the solution block vector on a graphics display.

29. The system of claim 28, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms.

30. The system of claim 28, wherein to construct the reduced transformed block sparse matrix the program instructions are configured to construct a transformed block sparse matrix having the same block structure and submatrix form as the block sparse matrix.

31. The system of claim 28, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms, and wherein the diagonal matrix comprises one or more singular values arranged in ascending order.

32. The system of claim 28, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms, and wherein to construct the reduced transformed block sparse matrix the program instructions are configured to multiply the left matrix by the reduced diagonal matrix to generate a temporary column matrix.

33. The system of claim 28, wherein the matrix equation represents a system of fluid flow equations in one or more dimensions having one or more pressure change terms and the one or more mass change terms, wherein the block sparse matrix contains one or more coefficients of the pressure change terms and the one or more coefficients of the mass change terms, and wherein to construct the reduced transformed block sparse matrix the program instructions are configured to
   multiply the left matrix by the reduced diagonal matrix to generate a temporary column matrix having a plurality of mass change terms coefficients, and
   assemble the mass change terms coefficients of the temporary column matrix into one or more temporary mass change terms coefficient submatrices that correspond to the mass change terms coefficients of the column matrix.

34. The system of claim 33, wherein to construct the reduced transformed block sparse matrix the program instructions are configured to premultiply each temporary mass change terms coefficient submatrix by the transpose of the right matrix to generate a transformed temporary mass change terms coefficient submatrix.

35. The system of claim 34, wherein to construct the reduced transformed block sparse matrix the program instructions are configured to premultiply each subvector containing the pressure change terms coefficients in the block sparse matrix by the transpose of the right matrix to generate a transformed pressure change terms coefficients subvector.

36. The system of claim 35, wherein to construct the reduced transformed block sparse matrix the program instructions are configured to postmultiply each fluid partial volumes subvector in the block sparse matrix by the right matrix to generate a transformed fluid partial volumes vector.

37. The system of claim 36, wherein to construct the reduced transformed block sparse matrix the program instructions are configured to construct a transformed block sparse matrix from one or more of the transformed temporary mass change terms coefficient submatrix, the transformed pressure change terms coefficients subvector and the transformed fluid partial volumes vector.

38. The system of claim 37, wherein to construct the reduced transformed block sparse matrix the program instructions are configured to eliminate one or more transformed fluid partial volumes that correspond to the discarded singular values in the transformed block sparse matrix to generate the reduced transformed block sparse matrix.

39. The system of claim 28, wherein to construct the reduced transformed block sparse matrix the program instructions are configured to
   determine a column matrix norm for the column matrix,
   skip the singular value decomposition if the column matrix norm is equal to or less than the predetermined threshold value,
   set the singular values to zero if the column matrix norm is equal to or less than the predetermined threshold value, and
   set the right matrix to the identity matrix if the column matrix norm is equal to or less than the predetermined threshold value.

40. The system of claim 39, wherein to determine the column matrix norm the program instructions are configured to calculate the Frobenius norm of the column matrix.

41. The system of claim 28, wherein the reduced transformed block sparse matrix comprises one or more reduced transformed diagonal submatrices and one or more reduced transformed off-diagonal submatrices, wherein each reduced transformed diagonal submatrix comprises mass change terms coefficients and pressure change terms coefficients only within the bottom $r_i+1$ rows and right most $r_i+1$ columns of each transformed diagonal submatrix.

42. The system of claim 41, wherein each reduced transformed off-diagonal submatrix comprises mass change terms coefficients and pressure change terms coefficients only within the bottom $r_i+1$ rows and the right most $r_j+1$ columns of each transformed off-diagonal submatrix.

43. The system of claim 28, wherein to construct the reduced transformed residual block vector the program instructions are configured to construct a transformed residual block vector.

44. The system of claim 28, wherein to construct the transformed residual block vector the program instructions are configured to construct a transformed residual block vector having a transformed mass balance residual subvector and a transformed volume constraint residual subvector.

45. The system of claim 28, wherein to construct the reduced transformed residual block vector the program instructions are configured to premultiply a mass balance residual subvector by the transpose of the right matrix to generate a transformed mass balance residual subvector.

46. The system of claim 28, wherein to solve for the solution block vector the program instructions are configured to solve for a reduced transformed solution change block vector using the reduced transformed block sparse matrix and the reduced transformed residual block vector.

47. The system of claim 28, wherein to solve for the solution block vector the program instructions are configured to:
   solve for a reduced transformed solution change block vector using the reduced transformed block sparse matrix and the reduced transformed residual block vector; and
   convert the reduced transformed solution change block vector to a solution change block vector.

48. The system of claim 28, wherein to solve for the solution block vector the program instructions are configured to add the solution change block vector to a current estimate of the solution block vector to update the solution block vector.

49. The system of claim 28, wherein to solve for the solution block vector the program instructions are configured to:

solve for a reduced transformed solution change block vector using the reduced transformed block sparse matrix and the reduced transformed residual block vector; and convert the reduced transformed solution change block vector to a solution change block vector having one or more changes in mass unknowns and one or more changes in pressure unknowns.

50. The system of claim 28 comprising a printer coupled to the computer and configured to provide the solution block vector to a user.

* * * * *